United States Patent
Chopra et al.

(10) Patent No.: US 11,046,585 B2
(45) Date of Patent: Jun. 29, 2021

(54) MULTI-ATOMIC LAYERED MATERIALS

(71) Applicant: SABIC Global Technologies B.V., Bergen op Zoom (NL)

(72) Inventors: Nitin Chopra, Sugar Land, TX (US); Ihab N. Odeh, Sugar Land, TX (US)

(73) Assignee: SABIC GLOBAL TECHNOLOGIES B.V., Bergen op Zoom (NL)

( * ) Notice: Subject to any disclaimer, the term of this patent is extended or adjusted under 35 U.S.C. 154(b) by 115 days.

(21) Appl. No.: 16/316,508

(22) PCT Filed: Jun. 22, 2017

(86) PCT No.: PCT/IB2017/053739
§ 371 (c)(1),
(2) Date: Jan. 9, 2019

(87) PCT Pub. No.: WO2018/011651
PCT Pub. Date: Jan. 18, 2018

(65) Prior Publication Data
US 2019/0292061 A1    Sep. 26, 2019

Related U.S. Application Data

(60) Provisional application No. 62/362,840, filed on Jul. 15, 2016.

(51) Int. Cl.
*C01B 33/021* (2006.01)
*C30B 25/02* (2006.01)
(Continued)

(52) U.S. Cl.
CPC ............ *C01B 33/021* (2013.01); *C30B 25/02* (2013.01); *C30B 29/06* (2013.01); *C30B 29/60* (2013.01); *H01M 4/366* (2013.01); *H01M 4/38* (2013.01); *H01M 4/386* (2013.01); *H01M 4/90* (2013.01); *B82Y 30/00* (2013.01); *B82Y 40/00* (2013.01); *C01B 33/00* (2013.01); *C01P 2002/72* (2013.01); *C01P 2002/82* (2013.01); *C01P 2004/03* (2013.01); *C01P 2004/04* (2013.01); *C01P 2004/24* (2013.01)

(58) Field of Classification Search
None
See application file for complete search history.

(56) References Cited

U.S. PATENT DOCUMENTS

| 2011/0033746 A1 | 2/2011 | Liu et al. |
| 2015/0109606 A1* | 4/2015 | Peale ............ G01J 1/42 356/30 |
| 2015/0364754 A1 | 12/2015 | Egerton et al. |

FOREIGN PATENT DOCUMENTS

| JP | 2016097599 A * | 5/2016 |
| WO | WO 2015/121682 | 8/2015 |

OTHER PUBLICATIONS

Machine translation of JP 6,606,821 B2 (Year: 2019).*
(Continued)

*Primary Examiner* — Ramsey Zacharia
(74) *Attorney, Agent, or Firm* — Norton Rose Fulbright US LLP

(57) ABSTRACT

A multi-atomic layered material and methods of making and using the same are described. The material can include a first 2D non-carbon mono-element atomic layer, a second 2D non-carbon mono-element atomic layer, and intercalants positioned between the first and second atomic layers.

19 Claims, 13 Drawing Sheets

(51) Int. Cl.
| | |
|---|---|
| C30B 29/06 | (2006.01) |
| C30B 29/60 | (2006.01) |
| H01M 4/38 | (2006.01) |
| H01M 4/36 | (2006.01) |
| H01M 4/90 | (2006.01) |
| B82Y 30/00 | (2011.01) |
| B82Y 40/00 | (2011.01) |
| C01B 33/00 | (2006.01) |

(56) References Cited

OTHER PUBLICATIONS

Balendhran, et al., "Elemental Analogues of Graphene: Silicene, Germanene, Stanene, Phosphorene," *Nano Micro Small*, 11(6); 640-652, 2015.
Bhattacharya, et al., "Exploring Semiconductor Substrates for Silicene Epitaxy," *Applied Physics Letters*, 103; 123113, 2013.
Bhimanapati, et al., "Recent Advances in Two-Dimensional Materials Beyond Graphene," *ACS Nano*, 9(12); 11509-11539, 2015.
Cinquanta, et al., "Getting Through the Nature of Silicene: An $sp^2$-$sp^2$ Two-Dimensional Silicon Nanosheet," *The Journal of Physical Chemistry C*, 117(32); 16719-16724, 2013.
Crawley and Trost, eds., Applications of Transition Metal Catalysis in Drug Discovery and Development: An Industrial Perspective. John Wiley & Sons, 2012. Table of Contents only.
Drissi, et al., "DFT Investigations of the Hydrogenation Effect on Silicene/Graphene Hybrids," *Journal of Physics: Condensed Matter*, 24(48); 485502, 2012.
Editorial, "2D or Not 2D?" *Nature Chemistry*, 6; 747, 2014.
Gao, et al., "Novel Si Networks in the Ca/Si Phase Diagram Under Pressure," *The Journal of Physical Chemistry C*, 118(43); 25167-25175, 2014.
Georgakilas, et al., "Broad Family of Carbon Nanoallotropes: Classification, Chemistry, and Applications of Fullerenes, Carbon Dots, Nanotubes, Graphene, Nanodiamonds, and Combined Superstructures," *Chemical Reviews*, 115(11); 4744, 2015.
Hlatky, "Heterogeneous Single-Site Catalysts for Olefin Polymerization," *Chemical Reviews*, 100(4); 1347-1376, 2000.
Hoshyargar, et al., "Graphene-Type Sheets of $Nb_{1-x}W_xS_2$: Systhesis and In Situ Functionalization," *Dalton Translations*, 42(15); 5292-5297, 2013.
International Search Report and Written Opinion Issued in Corresponding PCT Application No. PCT/IB2017/053739, dated Oct. 13, 2017.
Jarupatrakorn & Tilley, "Silica-Supported, Single-Site Titanium Catalysts for Olefin Epoxidation. A Molecular Precursor Strategy for Control of Catalyst Structure," *Journal of the American Chemical Society*, 124(28); 8380-8388, 2002.
Jiang, et al., "Propane Dehydrogenation Over $Pt/TiO_2$—$Al_2O_3$ Catalysts," *ACS Catalysis*, 5(1); 438-447, 2015.
Kang, et al., "Solvent Exfoliation of Electronic-Grade, Two-Dimensional Black Phosphorus," *ACS Nano*, 9(4); 3596-3604, 2015.
Koski, et al., "Chemical Intercalation of Zerovalent Metals into 2D Layered Bi2Se3," *Journal of the American Chemical Society*, 134(33); 13773-13779, 2012.
Ling, et al., "Flexible and Conductive MXene Films and Nanocomposites with High Capacitance," *Proceedings of National Academy of Sciences, USA*, 111; 16676-16681, 2014.
Majumder, et al., "Nanoscale Hydrodynamics: Enhanced Flow in Carbon Nanotubes," *Nature*, 438(7064); 44, 2005.
Mendoza-Sanchez, et al., "Synthesis of Two-Dimensional Materials for Capacitive Energy Storage," *Advanced Materials*, 28; 6104-6135, 2016.
Nakano, "Preparation of Alkyl-Modified Silicon Nanosheets by Hydrosilytion of Layered Polysilane ($Si_6H_6$)," *Journal of American Chemical Society*, 134(12); 5452-5455, 2012.
Nakano, et al., "Soft Synthesis of Single-Crystal Silicon Monolayer Sheets," *Angewandte Chemie, International Edition*, 45(38); 6303-6306, 2006.
Okamoto, et al., "Silicon Nanosheets and Their Self-Assembled Regular Stacking Structure," *Journal of the American Chemical Society*, 132(8); 2710-2718, 2010.
Okamoto, et al., "Synthesis and Modification of Silicon Nanosheets and Other Silicon Nanomaterials," *Chemistry, A European Journal*, 17(36); 9864-9887, 2011.
Postole, et al., "Boron Nitride: A High Potential Support for Combustion Catalysts," *Thermochimica Acta*, 434(1-2); 150-157, 2005.
Roduner, "Size Matters: Why Nanomaterials are Different," *Chemical Society Reviews*, 35; 583-592, 2006.
Sattler, et al., "Catalytic Dehydrogenation of Light Alkanes on Metals and Metal Oxides," *Chemical Reviews*, 114(20); 10613-10653, 2014.
Selective Nanocatalysts and Nanoscience: Concepts for Heterogeneous and Homogeneous Catalysis, Editors: Adriano Zecchina, Silvia Bordiga, Elena Groppo, Wiley Online Library, 10.1002/9783527635689 Table of Contents only.
Seo, et al., "The Graphene-Supported Pd and Pt Catalysts for Highly Active Oxygen Reduction Reaction in an Alkaline Condition," *Electrochemistry Communications*, 13(2); 182-185, 2011.
Siddiqi, et al., "Catalysts Performance of Novel Pt/Mg(Ga)Al)O Catalysts for Alkane Dehydrogenation," *Journal of Catalysis*, 274; 200-206, 2010.
Stengl, et al., "Ultrasound Exfoliation of Inorganic Analogues of Graphene," *Nanoscale Research Letters*, 9(167), 1-14, 2014.
Sugiyama, et al., "Synthesis and Optical Properties of Monolayer Organosilicon Nanosheets," *Journal of the American Chemical Society*, 132(17); 5946-5947, 2010.
Yuan, et al., "The Rapid Exfoliation and Subsequent Restacking of Layered Titanates Driven by an Acid-Base Reaction," Angewandte Chemie International, 54(32); 9239-9243, 2015.
Zhang, et al., "Design of Half-Metallic Ferromagnetism in Germanene/Silicene Hybrid Sheet," *Solid State Communications*, 191; 49-53, 2014.
Zhang, et al., "Enhancement of Long Stability of Sulfure Cathode by Encapsulating Sulfure in Micropores of Carbon Spheres," *Energy & Environmental Science*, 3(10); 1531-1537, 2010.
Zhang, et al., "Layered SiC Sheets: A Potential Catalyst for Oxygen Reduction Reaction," *Science Reports*, 4; 3821, 2014.

* cited by examiner

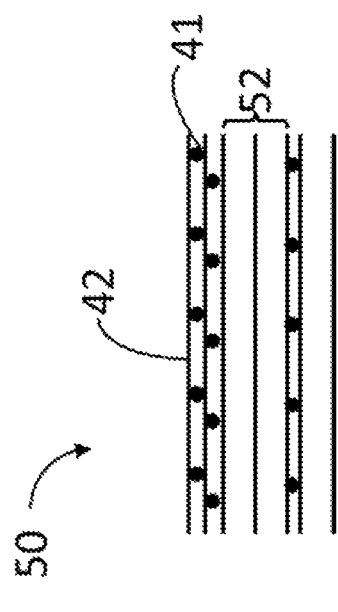
FIG. 4
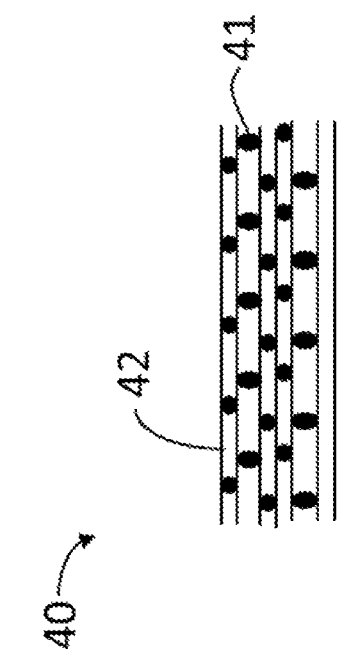
FIG. 5A
FIG. 5B
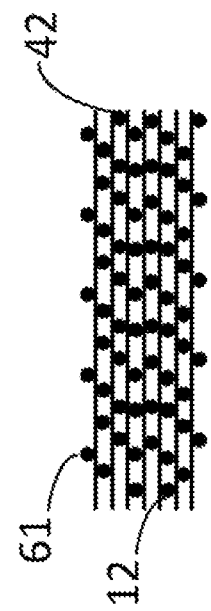
FIG. 6

Multi layer Silicene    Intercalated Au nanoparticle

MULTI-ATOMIC LAYERED MATERIALS

CROSS REFERENCE TO RELATED APPLICATIONS

This application is a national phase application under 35 U.S.C. § 371 of International Application No. PCT/IB2017/053739 filed Jun. 22, 2017, which claims the benefit of priority of U.S. Provisional Patent Application No. 62/362,840 filed Jul. 15, 2016. The entire contents of each of the above-referenced disclosures are specifically incorporated herein.

BACKGROUND OF THE INVENTION

A. Field of the Invention

The invention generally concerns multi-atomic layered materials comprising non-carbon 2D mono-element atomic layers (e.g., silicene, germanene, stanene, phosphorene, lead or borophene) having intercalants positioned between the atomic layers. The materials can be used in a variety of applications (e.g., catalysis, energy storage/conversion/transport, thermal devices, bioanalytical devices, mechanical devices, electrical devices, sensors, actuators, piezo-devices, smart textiles, flexible devices, photo devices, optical devices, optoelectronic devices, display devices, high-performance nanocomposites, etc.).

B. Description of Related Art

Graphene, given its high stability, relative ease of synthesis, and inherent planar structure (i.e., due to $sp^2$ hybridization of the constituent carbon atoms that comprise graphene), has been the subject of intense research for a wide variety of applications since its discovery in 2004. Such applications include the use of graphene as a catalyst support structure (See M. H. Seo, et al., *Electrochemistry Communications*, Vol. 13, No. 2, (2011)). One potential issue with using graphene in this context is that—at the high reaction temperatures at which catalytic reactions are typically conducted—graphene may serve as a source of carbon, which can deposit on the surface of the active catalyst, reducing the available active surface area and reducing catalyst lifetime. Another drawback is that—although pure graphene is chemically inert—graphene-based materials (e.g., graphene oxide or otherwise functionalized graphene) have inherent catalytic properties. Given that, in practice, pure graphene is rarely obtained, the use of impure graphene may interfere with desired catalytic reactions. Therefore, while catalytic metals may be combined with the 2D graphene layers, the resulting material may not be entirely suitable for use in catalysis. A further, yet related, drawback of graphene is its susceptibility to oxidation. As such, catalytic reactions of which oxygen is either a reactant or product may oxidize the surface (i.e., producing graphene oxide) thereby exacerbating the catalytic effects of graphene-oxide mentioned above. In such situations, even pure graphene could be unsuitable, as it would oxidize during the course of the reaction and become reactive itself, interfering with the main catalytic reaction.

Compound (as opposed to single-element) material systems have been explored in an effort to discover additional candidates in which catalytic metals may be incorporated into the materials. One such system, which is structurally analogous to graphene (i.e., having $sp^2$ hybridization, which manifests in planar geometry), is boron nitride (BN) (See, G. Postol, e et al., *Thermochimica Acta*, Vol. 2005, 434, No. 1-2). While BN is a ceramic, an ideal class of compounds for use as catalyst support structures, it nevertheless remains susceptible to oxidation at temperatures at which catalytic reactions are typically conducted, which may—as is the case with graphene—interfere with the primary desired catalytic reaction. Other studies have reported nanoparticle incorporation into monolithic materials (as opposed to layered structures that result from $sp^2$ orbital hybridization) (See, H. Y. Yuan et al., *Angewandte Chemie International*, 2015, Vol. 54, No. 32; F. Hoshyargar, et al., *Dalton Transactions*, 2013, Vol. 42; K. J. Koski, et al., *Journal of the American Chemical Society*, 2012, Vol. 134). Yuan, et al., for instance, demonstrated ion-assisted exfoliation of monolithic protonated titanate hydrate structures ($H_{1.07}Ti_{1.73}O_4$ $H_2O$), but reported no nanostructure intercalation upon exfoliation. Hoshyargar, et al., similarly demonstrated ion-assisted exfoliation of niobium tungsten sulfide ($Nb_{1-x}W_xS_2$) followed by surface functionalization with gold nanoparticles; a major drawback of using this material in catalysis, however, is the introduction of sulfur, a well-known catalyst poison, which may sublime at the catalytic reaction temperatures or otherwise diffuse into the catalyst nanostructures, causing deactivation. Koski, et al., demonstrated incorporation of zero-valent metal atoms (silver (Ag), gold (Au), cobalt (Co), copper (Cu), iron (Fe), indium (In), nickel (Ni), and tin (Sn)) in monolithic bismuth selenide ($Bi_2Se_3$). This technology suffers several drawbacks: first, the exfoliation was not reported, which is critical to achieve high catalyst loading; second, only metal atoms, and not nanostructures, were incorporated, meaning the crystallographic structure of the parent material remained intact, thereby making it extremely difficult—if not impossible—for organic species (i.e., the reactants in a catalysis reaction) to reach the catalytic metal atoms; third, selenium is itself a catalyst in a number of reactions and may compete with the primary desired catalytic reaction; and fourth, selenium belongs to the same chemical family as sulfur, and—given that elements belonging to the same family exhibit similar chemical behavior—may also poison the metal catalysts to which the $Bi_2Se_3$ material might serve as a support structure. In light of the drawbacks inherent to these compound material systems, the need for mono-element 2D nanosheets (i.e., graphene analogues) persists.

Two-dimensional graphene analogues have been demonstrated wherein the parent substrate was comprised of silicon (See H. Okamoto, et al., *Chemistry—A European Journal*, 2011, Vol. 17, No. 36. However, the methods reported used either a starting material of calcium silicide ($CaSi_2$) or alkoxide-terminated organosiloxenes ($Si_6H_5OR$). In the case where the parent substrate was $CaSi_2$, the resulting layered material: (1) was silicon sub-oxide ($SiO_x$, where x~1)—not silicon; (2) had no intercalated nanostructures between discrete 2D $SiO_x$ sheets; and (3) was not allowed to restack. In the case where $Si_6H_5OR$ was used to produce 2D silicon-based graphene analogues, surfactant (R) incorporation was essential in order to achieve exfoliation, but the presence of such surfactants is inappropriate for use in catalysis, as the organic surfactant would serve as a source of carbon, effectively coking the catalyst and reducing its lifetime.

While methods exist for producing high-purity mono-element graphene analogues, such processes employ vapor-phase deposition and require a substrate on which the analogues can be grown. These methods are inherently infeasible from a commercial standpoint as they can be expensive and are capable of low-throughput only.

SUMMARY OF THE INVENTION

A solution to the aforementioned problems associated with producing and using graphene analogues has been discovered. The solution resides in an elegant process that allows for the production of multi-atomic layered materials comprising a first 2D non-carbon mono-element atomic layer, a second 2D non-carbon mono-element atomic layer, and intercalants (e.g., a plurality of one intercalant or a mixture of at least two different intercalants) positioned between the first and second atomic layers. The non-carbon mono-element atomic layers can be silicene atomic layers, germanene atomic layers, stanene atomic layers, phosphorene atomic layers, lead atomic layers, or borophene atomic layers, or combinations thereof. The process for making these materials can include obtaining a liquid composition comprising a multi-atomic layered non-carbon mono-element stack dispersed therein and exfoliating the multi-atomic layered non-carbon mono-element stack in the liquid composition in the presence of an intercalant(s) or precursor(s) thereof. Without wishing to be bound by theory, it is believed that once the layers or sheets are exfoliated (e.g., partial or full exfoliation), they can be stabilized by the intercalants or precursors thereof through bond formation between the surface of the exfoliated layers or sheets and the intercalants or precursors thereof (e.g., ionic bonds, covalent bonds, van der Waals forces, hydrogen bonds, or mechanical bonds, or any combination thereof). This bond formation is believed to help prevent, avoid, or reduce restacking of the exfoliated layers or sheets. Also without wishing to be bound by theory, it is believed that the surfaces of the exfoliated sheets can form $sp^3$-hybridized bonds, thereby facilitating bonding between the sheets and the intercalants or precursors thereof. Once stabilized, the exfoliated sheets or layers can be allowed to re-aggregate or restack (e.g., through bond formation between the exfoliated sheets and/or the intercalants or precursors thereof) to form the multi-atomic layered materials of the present invention. If precursor material is used, then it can form into intercalants during the exfoliation, re-aggregation, and/or restacking process. Alternatively, and in instances where a precursor material is present in the reformed stack, it can then be processed into an intercalant, the size of which can be controlled or limited by the physical presence of the surrounding re-aggregated atomic layers.

The resulting material of the present invention can have distorted structures and/or bonding characteristics between the layers that are different from those of other 2D materials (e.g., graphene, transition metal dichalcogenides (TMD's) and transition metal carbides (MXenes). These distorted structures and/or bonding characteristics can provide several advantages. By way of example, the intercalant can have reduced susceptibility to sintering or aggregation during use due to fixed inter-particle spacing between intercalants, and/or confinement due to restacked layers where the intercalant is intercalated between the layers, which results from the anchoring of the intercalants to the 2D layers. This anchoring can immobilize the intercalants such that they substantially or fully remain in a fixed position. This inter-particle spacing along with the confined space between the atomic layers can also enhance chemical reaction selectivity and conversion for use in catalytic applications. Also, the unique surface chemistry, surface morphology, and physical characteristics provided by the non-carbon mono-element atomic layers offer additional possible advantages ranging from the introduction of a high density of defects (e.g., edges, steps, distorted lattice) in the materials, anisotropic properties of the materials, and/or their overall stable architecture. Even further, additional functionality can be obtained, if desired, by functionalizing the non-carbon mono-element atomic layers before exfoliation, during exfoliation, or after reformation of the stack. In addition to catalysis, these attributes can provide a wide variety of other uses of the materials of the present invention (e.g., uses such as catalysts for chemical reactions, energy storage/conversion/transport devices, actuators, piezo-devices, sensors, smart textile, flexible devices, electronic and optical devices, high-performance nanocomposites, etc.). In one preferred instance, and as noted above, the materials can be used as catalysts given the intercalant segregation and confined space of the surrounding mono-element layers, each of which can reduce sintering and enhance selectivity and conversion parameters, respectively, ultimately manifesting in longer catalyst lifetime with increased reaction and production efficiency.

In one embodiment of the present invention, there is disclosed an intercalated 2D non-carbon mono-element multi-atomic layered material. This material can include a plurality of 2D non-carbon mono-element atomic layers (e.g., silicene, germanene, stanene, phosphorene, borophene) having a plurality of intercalated intercalants or precursors thereof. In one particular embodiment, all layers are comprised of the same element, i.e., silicon (Si; silicene), germanium (Ge; germanene), tin (Sn; stanene), phosphorous (P; phosphorene), lead (Pb), or boron (B; borophene). In a separate embodiment, the layers that includes the material may be comprised of different elements (i.e., the first layer of a multi-layer structure may be any one of silicene, germanene, stanene, phosphorene, lead, or borophene, and the second layer within the same multi-layer structure may be drawn from this same list, excluding the material of which the first layer is comprised). An additional elemental layer or layers that can be incorporated into the materials of the present invention include graphene or graphene derivatives, graphane or graphane derivatives, or graphyne or graphyne derivative layers, or combinations thereof (e.g., material of the present invention having non-carbon mono-elemental layers in combination with graphene, graphane, and/or graphyne layers, or oxides thereof).

The multi-atomic layered material can be derived from a parent substance through an exfoliation process described in detail below. In one embodiment, the parent substance may be comprised of a plurality of atomic layers having intercalants between the layers. Such layers can have inter-layer spacing and are being held together by van der Waals forces or $sp^3$-hybridized bonding, or both. In one embodiment, the layered structures (i.e., either the final material—post-exfoliation and restacking—or the parent from which the 2D layers are drawn) may be oxidized. Such oxidation may be an inherent aspect of the parent substance, or individual layers or sets of layers (i.e., substituents of the parent structure) may become oxidized (i.e., chemically) during the course of the exfoliation process below (a number of these features and aspects of the materials described here are discussed in greater detail below). In a separate embodiment, all such layers can be non-oxidized. In still another embodiment, one or more layers may be oxidized, while at least one of the remaining layers is non-oxidized.

In some instances, the above-mentioned intercalants or precursors therefore are positioned (e.g., immobilized) between the first and second atomic layers and can fill 1% to 80%, preferably 30% to 60%, of the volume between each 2D layer once restacked. The intercalant(s) can include a metal, a metal oxide, a carbon-based intercalant, a metal organic framework, a zeolitic imidazolated framework, a covalent organic framework, ionic liquids, liquid crystals, or atomic clusters or nanoparticles comprising a metal or an oxide or alloy thereof, or any appropriate precursor thereof (including organometalic compounds, solubilized complexes, or solvated ions), or any combination (i.e., of intercalants and precursors) thereof. The metal can be a noble metal, a transition metal, or a combination or alloy or oxide thereof. In still other instances, the intercalant(s) may be comprised of compound semiconductors compounds from Columns 12-16, 13-15, or 14-16 of the Periodic Table, taking the general formula $M_iE_j$, where i=12, 13, or 14 and j=15 or 16. Any such metalloid or semiconductor element(s) or compound(s) may further include an appropriate dopant. Non-limiting examples of a carbon-based intercalant may include polymers, block copolymers, or polymer brushes. In a preferred embodiment, the intercalant(s) are single-site catalysts capable of catalyzing a chemical reaction. The intercalant can have a size of 1 nm to 1000 nm, preferably 1 nm to 50 nm, or more preferably 1 nm to 5 nm, in at least one dimension, at least two dimensions, or all three dimensions. The shape of the intercalant can be of a wire, a particle (e.g., having a substantially spherical shape), a rod, a tetrapod, a hyper-branched structure, a tube, a cube, or an irregular shape. A total weight percentage of the intercalant(s) can range from 1 wt. % to 90 wt. %.

The multi-atomic layered materials described above can be produced in the following manner. First, the parent substance—which is a multi-atomic layered non-carbon stack comprised of either Si, Ge, Sn, P, or B—or, in situations where a plurality of such substances are employed, carbon (C), in which case the carbonaceous stack may be graphene or graphyne—is dispersed in a liquid. In one embodiment, the liquid is water (i.e., thereby forming an aqueous formulation). In a separate embodiment, the liquid is a carbon-based (i.e., organic) solvent. The liquid also contains an appropriate intercalant, described above, or precursor therefore. In some instances, the liquid may also contain compounds suitable for passivating or functionalizing the surface of the multi-atomic layered stack. Non-liming examples of such functionalization agents include chemical groups such as amines, amides, azoles, sulfides, phosphides, phosphines, sulfides, sulfates, thiols, hydrogen, diazonium, thionyl, alkyls, cyanides, poly-peptides, bromides, oxides, epoxides, ethers, ketones, hydroxides, benzyl, glycol, carbodiimide, or ester, or any combination thereof.

Second, the multi-atomic layered stack(s) are exfoliated. Preferred, but non-limiting, methods for exfoliation include chemical exfoliation, chemo-mechanical exfoliation, zipper exfoliation, polar or non-polar solvent exfoliation, ionic liquid based exfoliation, or sonication of the liquid composition. In one embodiment, the process of exfoliation may cause a single layer to partially or fully separate from the parent structure. In a separate embodiment, exfoliation may cause a plurality of layers to partially or fully separate from the parent structure. In preferred instances, no more than ten layers are exfoliated in a single exfoliation event. In such embodiments, all exfoliated substituents may have the same number of layers, n; or, one such substituent may have a number of layers, $n_1$, and another such substituent may have a number of layers, $n_2$, such that $n_1$ does not equal $n_2$. In any such embodiment, all exfoliated substituents have a number of layers, $n_i$, (where i denotes an individual exfoliated substituent; therefore, i ranges from 1 to the total number of exfoliated substituents) such that n is typically less than or equal to ten. Upon exfoliation, the substituents can be exposed to the intercalant and/or precursors thereof, and/or compounds whose purpose is to attach to, or adsorb on, the surface of the exfoliated substituent, and/or compounds whose purpose is to oxidize the surface of the exfoliated substituent, or any combination thereof. Alternatively, the multi-atomic layered stack(s) can be exposed to the intercalant and/or precursors thereof during the exfoliation process.

Third, the exfoliated multi-atomic layered non-carbon mono-element stack(s) can be allowed to re-aggregate with the intercalant, or precursors thereof, positioned between (preferably intercalated) layers. In one embodiment, these intercalants or precursors thereof can be contained between a first 2D non-carbon mono-element atomic layer and a second 2D non-carbon mono-element atomic layer of the stack. In some instances, if precursor materials are positioned between the 2D layers, such precursor materials may be further processed into intercalants that include, as non-limiting examples, the materials described above and throughout this specification.

The product of the synthesis process described above may be suitable for catalyzing a chemical reaction by contacting said material with a reactant feed to catalyze the reaction and produce a product feed. Non-limiting examples of chemical reactions include a hydrocarbon cracking reaction, a hydrogenation of hydrocarbon reaction, a dehydrogenation of hydrocarbon reaction, an environmental remediation reaction, an epoxidation reaction, an automobile catalytic reaction, a solar energy harvesting reaction, a petrochemical conversion reaction, an oxidative coupling of methane reaction, a carbon dioxide to carbon monoxide conversion reaction, a methane to methanol reaction, a methanol to ethylene reaction, a water splitting, a hydrogen gas and oxygen to hydrogen peroxide reaction, a benzene to phenol reaction, an aryl to amine reaction, a benzene with $NH_3$ to $Bz-NH_2$ reaction, etc. The product of the synthesis process described above may be further incorporated or used in an article of manufacture. Non-limiting articles of manufacture include energy storage devices, transport or conversion devices, actuators, piezoelectric devices, sensors, smart textiles, flexible devices, electronic devices, optical devices, optoelectronic devices, electro-optical devices, plasmonic devices, delivery devices, polymer nanocomposites, MEMS/NEMS devices, logic devices, filtration/separation devices, capturing devices, electrochemical devices, display devices, etc.

In one aspect of the invention, 20 embodiments are described. Embodiment 1 is a multi-atomic layered material comprising a first 2D non-carbon mono-element atomic layer, a second 2D non-carbon mono-element atomic layer, and intercalants positioned between the first and second atomic layers. Embodiment 2 is the multi-atomic layered material of embodiment 1, wherein the first and second atomic layers have an inter-layer spacing and are held together by van der Waals forces or sp3-hybridized bonding, or both. Embodiment 3 is the multi-atomic layered material of any one of embodiments 1 to 2, wherein the first and second atomic layers are each individually a silicene atomic layer, a germanene atomic layer, a stanene atomic layer, a phosphorene atomic layer, a lead atomic layer, or a borophene atomic layer. Embodiment 4 is the multi-atomic layered material of embodiment 3, wherein the first and second atomic layers are both: silicene atomic layers; germanene atomic layers; stanene atomic layers; phosphorene atomic layers; lead atomic layers; or borophene atomic layers. Embodiment 5 is the multi-atomic layered material of embodiment 3, wherein the first and second atomic layers are different. Embodiment 6 is the multi-atomic layered material of any one of embodiments 3 to 5, wherein the first or second atomic layers, or both layers, are functionalized. Embodiment 7 is the multi-atomic layered material of any one of embodiments 1 to 6, comprising up to ten 2D non-carbon mono-element atomic layers. Embodiment 8 is the multi-atomic layered material of any one of embodiments 1 to 7, wherein the intercalants are affixed between the first and second atomic layers. Embodiment 9 is the multi-atomic layered material of any one of embodiments 1 to 8, wherein the intercalants are polymers, block copolymers, polymer brushes, carbon-based intercalants, metal organic frameworks, zeolitic imidazolated frameworks, covalent organic frameworks, ionic liquids, liquid crystals, or atomic clusters or nanoparticles comprising a metal or an oxide or alloy thereof, or any combination thereof. Embodiment 10 is the multi-atomic layered material of embodiment 9, wherein the metal is a noble metal or a transition metal or a combination or alloy or oxide thereof. Embodiment 11 is the multi-atomic layered material of any one of embodiments 1 to 10, wherein the first and second atomic layers are oxidized. Embodiment 12 is the multi-atomic layered material of any one of embodiments 1 to 11, wherein the first and second atomic layers are non-oxidized. Embodiment 13 is the multi-atomic layered material of any one of embodiments 1 to 12, wherein the material further comprises a 2D atomic layer of graphene, graphyne, or graphane. Embodiment 14 is the multi-atomic layered material of embodiment 1, comprised in an energy storage/conversion/transport device, a sensor, a flexible sensor, an electronic device, an optoelectronic device, an optical device, a photo device, a thermal device, a coating material, or a catalyst. Embodiment 15 is a method of making any one of the multi-atomic layered materials of embodiments 1 to 13, the method comprising: (a) obtaining a liquid composition comprising a multi-atomic layered non-carbon mono-element stack dispersed therein; (b) exfoliating the multi-atomic layered non-carbon mono-element stack in the liquid composition in the presence of a intercalant or a precursor thereof and (c) allowing the exfoliated multi-atomic layered non-carbon mono-element stack to re-aggregate and position the intercalant or precursor thereof between at least a first 2D non-carbon mono-element atomic layer and a second 2D non-carbon mono-element atomic layer of the stack to obtain the multi-atomic layered material of any one of embodiments 1 to 13. Embodiment 16 is the method of embodiment 15, wherein the exfoliating step (b) comprises chemical exfoliation, chemo-mechanical exfoliation, zipper exfoliation, polar or non-polar solvent exfoliation, ionic liquid based exfoliation, or sonication of the liquid composition. Embodiment 17 is the method of any one of embodiments 15 to 16, wherein the multi-atomic layered non-carbon mono-element stack is a plurality of silicene atomic layers, a plurality of germanene atomic layers, a plurality of stanene atomic layers, a plurality of phosphorene atomic layers, a plurality of lead atomic layers, or a plurality of borophene atomic layers, or any combination of such stacks. Embodiment 18 is the method of embodiment 17, wherein a homogenous multi-atomic layered material having the intercalant or precursor thereof positioned between the first and second atomic layers is obtained. Embodiment 19 is the method of any one of embodiments 15 to 17, wherein the liquid composition comprises a first multi-atomic layered non-carbon mono-element stack and a second multi-atomic layered non-carbon mono-element stack that is different from the first stack, and wherein a heterogeneous multi-atomic layered material having the intercalant or precursor thereof positioned between the first and second atomic layers is obtained. Embodiment 20 is the method of any one of embodiments 15 to 19, wherein a precursor intercalant is positioned between the first and second atomic layers, and wherein the precursor material is further processed into the intercalant.

The following includes definitions of various terms and phrases used throughout this specification.

The phrase "multi-atomic layered" refers to a sheet-like material, either as free-standing films or flakes, or a substrate-bound coating, consisting of a small number (e.g., between 2 and about 10) of well-defined, countable, stacked atomic layers of silicon, germanium, tin, phosphorous, lead, or boron layers of extended lateral dimension. The atomic orbitals of each atom in such structures may be $sp^2$ and/or $sp^3$ hybridized. These materials can have properties and/or structures that are not present in graphene or graphene-based materials. The following includes non-limiting examples of these different properties and/or structures: 1) the inter-layer spacing of these materials can be less than graphene; 2) the structure of the materials can be distorted due to unsatisfied bonds in the plane, which allow $sp^3$ hybrid inter-layers or layers that are close and/or held by weak van der Waals; 3) due to 1) and 2) pristine forms of the materials may not be obtained from solution exfoliation techniques; 4) the materials can have bond lengths longer than graphene or graphene-like 2D systems, which can results in negligible or lower pi orbital overlaps and leads to $sp^3$ hybridization between the layers and distortion in the lattice, thereby creating base structures that are different than the 2D flatlands like graphene or graphene-based materials and/or 5) the materials can have mechanical distortion, inherent structural design, and/or dopant to impart or intrinsically exhibit a band gap. In some particular instances where graphene, graphane, or graphyne are also included as layers in the materials of the present invention, the materials can also include an atomic layer or layers of carbon.

The terms and phrases "immobilized," "affixed," "affixed in one place," and "pinned in one place" each refer to any manner in which an intercalant(s) or a precursor(s) thereof is brought into contact with the surface of a 2D non-carbon mono-element multi-atomic layer. Chemical bonding, immobilization, affixed in place, or pinned in place refers to intercalation, embedding, confining, chemisorption, physisorption, or adsorption of intercalants or precursors thereof to the surface of any given 2D non-carbon mono-element layer of the material of the present invention.

The terms "monolithic," "pristine," or "bulk" are used with reference to materials that serve as the parent stack from which 2D mono-element atomic layers are exfoliated, and includes materials that are either single- or poly-crystalline.

"Intercalant" refers to a material that has been positioned between two non-carbon mono-element 2D layers where the intercalant contacts at least one, preferably, both layers. Non-limiting shapes of the intercalant can be a wire, a particle (e.g., having a substantially spherical shape), a rod, a tetrapod, a hyper-branched structure, a tube, a cube, or an irregular shape.

"Contact" means direct physical contact, mechanical bonding or through chemical bonding. Chemical bonding includes ionic bonds, covalent bonds, metallic bonds, van der Waals forces, or hydrogen bonds, mechanical bonds or noncovalent bonds, or any combination thereof.

"Exfoliation" includes partial exfoliation as shown, for example, in FIGS. 2B and 5B, and full exfoliation as shown, for example, in FIGS. 2A and 4. By way of example, partial exfoliation can include a non-carbon mono-element 2D layer that is partially separated from a stack of such layers (e.g., a portion of the 2D layer is in direct contact with the stack while another portion of the 2D layer is not in direct contact with the stack). Full exfoliation, by way of example, can include a non-carbon mono-element 2D layer that is fully separated from a stack of such layers (e.g., the 2D layer is not in direct contact with any portion of the stack).

The term "about" or "approximately" are defined as being close to as understood by one of ordinary skill in the art, and in one non-limiting embodiment the terms are defined to be within 10%, preferably within 5%, more preferably within 1%, and most preferably within 0.5%.

The term "substantially" and its variations are defined as being largely but not necessarily wholly what is specified as understood by one of ordinary skill in the art, and in one non-limiting embodiment substantially refers to ranges within 10%, within 5%, within 1%, or within 0.5%.

The terms "wt. %" or "vol. %" refers to a weight or volume percentage of a component, respectively, based on the total weight or the total volume of material that includes the component. In a non-limiting example, 10 grams of component in 100 grams of the material is 10 wt. % of component.

The terms "inhibiting" or "reducing" or "preventing" or "avoiding" or any variation of these terms, when used in the claims and/or the specification includes any measurable decrease or complete inhibition to achieve a desired result.

The term "effective," as that term is used in the specification and/or claims, means adequate to accomplish a desired, expected, or intended result.

The use of the word "a" or "an" when used in conjunction with the term "comprising" in the claims or the specification may mean "one," but it is also consistent with the meaning of "one or more," "at least one," and "one or more than one."

The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The intercalated 2D non-carbon mono-element multi-atomic layered materials of the present invention can "comprise," "consist essentially of," or "consist of" particular ingredients, components, compositions, etc. disclosed throughout the specification. With respect to "consisting essentially of," a basic and novel characteristic of the materials of the present invention is the positioning of intercalants between a first 2D non-carbon mono-element atomic layer and a second 2D non-carbon mono-element atomic layer.

Other objects, features and advantages of the present invention will become apparent from the following figures, detailed description, and examples. It should be understood, however, that the figures, detailed description, and examples, while indicating specific embodiments of the invention, are given by way of illustration only and are not meant to be limiting. Additionally, it is contemplated that changes and modifications within the spirit and scope of the invention will become apparent to those skilled in the art from this detailed description. In further embodiments, features from specific embodiments may be combined with features from other embodiments. For example, features from one embodiment may be combined with features from any of the other embodiments. In further embodiments, additional features may be added to the specific embodiments described herein.

BRIEF DESCRIPTION OF THE DRAWINGS

Advantages of the present invention may become apparent to those skilled in the art with the benefit of the following detailed description and upon reference to the accompanying drawings.

FIG. 4 is a schematic of a fully exfoliated multi-atomic layered non-carbon mono-element stack with intercalant(s) and/or precursor(s) immobilized to the surface and whose layers were allowed to restack, resulting in a multi-layered stack with intercalant(s) and/or precursor(s) thereof are positioned between or immobilized between each multi-atomic non-carbon mono-element layer.

FIG. 5A is a schematic of an fully exfoliated multi-atomic layered non-carbon mono-element stack whose surface has been functionalized in the manner depicted in FIG. 3 and whose layers were allowed to restack, resulting in a multi-layered stack with intercalants(s) and/or precursor(s) thereof are positioned between or immobilized between some—but not all—multi-atomic non-carbon mono-element layers.

FIG. 5B is a schematic of a partially exfoliated multi-atomic layered non-carbon mono-element stack with intercalant(s) and/or precursor(s) positioned between or immobilized between multi-atomic non-carbon mono-element layers.

FIG. 6 is a schematic of an exfoliated multi-atomic layered non-carbon mono-element stack whose layers were allowed to restack, resulting in a multi-layered stack with precursors positioned between or immobilized between each layer.

Figure 1A:
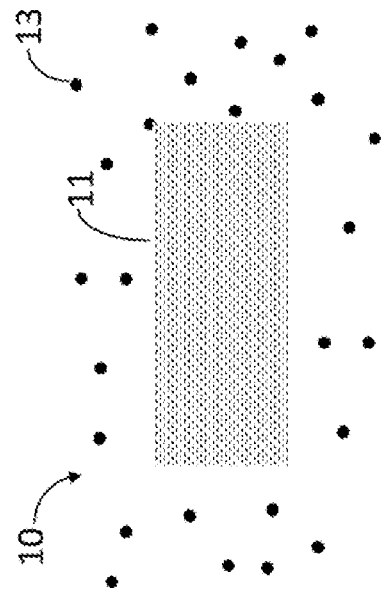
FIGS. 1A and 1B are schematics showing a multi-atomic layered non-carbon mono-element stack dispersed in a fluid medium in the presence of a plurality of intercalant(s) (FIG. 1B) and/or precursor(s) thereof (FIG. 1A).

While the invention is susceptible to various modifications and alternative forms, specific embodiments thereof are shown by way of example in the drawings and may herein be described in detail. The drawings may not be to scale.

DETAILED DESCRIPTION OF THE INVENTION

A solution that overcomes the problems associated with producing and using intercalated 2D non-carbon mono-element multi-atomic layered material has been discovered. The solution is premised on a process that enables the production of multi-atomic layered materials with intercalant(s) and/or precursor(s) thereof intercalated between 2D non-carbon mono-element atomic layers. The non-carbon mono-element atomic layers can be silicene atomic layers, germanene atomic layers, stanene atomic layers, phosphorene atomic layers, borophene atomic layers, lead atomic layers, or combinations thereof. Without wishing to be bound by theory, it is believed that exfoliating 2D non-carbon mono-element multi-layered stacks in the presence of intercalant(s) and/or precursor(s) thereof allows the intercalant(s) and/or precursor(s) to affix to the surface of the exfoliated layers. This affixation is believed to stabilize the $sp^3$ hybridized bonding orbitals on the exposed exfoliated surfaces, which can—if left unpassivated—result in irreversible self-aggregation and/or self-folding, rendering the material potentially un-useful with regards to target applications. Re-aggregation of the exfoliated layers can then result in the materials of the present invention.

These and other non-limiting aspects of the present invention are discussed in further detail in the following sections with reference to the Figures.

A. Intercalated 2D Non-Carbon Mono-Element Multi-Atomic Layered Material

The intercalated 2D non-carbon mono-element multi-atomic layered material of the present invention includes a multi-atomic layered material that includes a first 2D non-carbon mono-element atomic layer, a second 2D non-carbon mono-element atomic layer, and intercalant(s) or precursor(s) thereof positioned between the first and second atomic layers.

1. Mono-Element Atomic Layers

The mono-element atomic layers can be drawn from a monolithic parent substrate of the same material. Such parent substrates can be included—in whole or in part—of either Si, Ge, Sn, P, Pb, or B, provided that the composition of the layers is confined to a single element in the final material. In some embodiments, suitable parent substrate material can include monolithic slabs, chunks, or stacks of the target material (i.e., Si, Ge, Sn, P, Pb, or B). In other instances, the parent substrate from which the mono-element atomic layers are drawn may be multi-element compounds, non-limiting examples of which include SiM, GeM, SnM, PM, and BM, where M is a Column 1 metal (e.g., lithium (Li), sodium (Na), potassium (K)) or a Column 2 metal (e.g., magnesium (Mg), calcium (Ca)). In some embodiments, each dimension of the parent substrate may range from 1 nanometer (nm) to 10 millimeters (mm) ($10^7$ nm) in size. In preferred embodiments, each dimension can range from 10 nanometers to 1 millimeter in size. In more preferred embodiments, each dimension can range from 100 nanometers to 100 micrometers ("microns").

In some embodiments, single parent substrate material can be used. In other instances, a plurality of parent substrate materials can be used. For example, Si and Ge parent substrates can be used together to generate a 2D non-carbon mono-element multi-atomic layered material with intercalant(s) and/or precursor(s) thereof intercalated throughout, where the final material has alternating layers of both Si and Ge, wherein the frequency with which the layers alternate is either uniform (i.e., Si/Ge/Si/Ge), or variable (i.e., random). In embodiments where a single parent substrate substance is used, graphene, graphane, and graphyne are excluded from the list from which 2D mono-element layers may be drawn. In other embodiments where a plurality of parent substrates are used to produce the final material, graphene (along with graphane and graphyne) can be included in the list from which 2D mono-element layers may be drawn. Stated another way, graphene is not used by itself as a source of 2D mono-element layers, but graphene, TMDs, MXenes or any other 2D mono-element can be used as a source of 2D mono-element layers if done so in combination with one or more of either Si, Ge, Sn, P, Pb, or B parent substrates. In some embodiments, Zintl phases are used as the parent substrate. A Zintl phase can be the reaction product of Column 1 or 2 metals and a Column 13-16 metal or metalloid. Non-limiting examples of Zintl phases include calcium disilicide ($CaSi_2$), NaTl, or the like.

2. Intercalant(s) and Precursor(s) Suitable for Intercalation

The intercalant(s) can include any material having a size, which allows it to intercalate between two layers of the 2D multi-atomic layered material. Non-limiting examples of an intercalant include a metal, a metal oxide, a carbon-based intercalant, a metal organic framework, a zeolitic imidazolated framework, a covalent organic framework, ionic liquids, liquid crystals, or atomic clusters or nanoparticles comprising a metal or an oxide or alloy thereof. The metal can be a noble metal (e.g., palladium (Pd), platinum (Pt), gold (Au), rhodium (Rh), ruthenium (Ru), rhenium (Re), osmium (Os) or iridium (Ir), or any combinations or alloys thereof, or a transition metal (e.g., silver (Ag), copper (Cu), iron (Fe), nickel (Ni), zinc (Zn), manganese (Mn), chromium (Cr), molybdenum (Mo), tungsten (W), or tin (Sn), or any combinations or oxides or alloys thereof. In other instances, the intercalant(s) can include a metalloid or a semiconductor element(s), such as boron (B), silicon (Si), germanium (Ge), arsenic (As), antimony (Sb), tellurium (Te), polonium (Po) or derivatives thereof, or combinations thereof. In still other instances, the intercalant(s) may be comprised of compound semiconductors compounds from Columns 12-16, 13-15, or 14-16 of the Periodic Table, taking the general formula $M_iA_j$, where i=12, 13, or 14 and j=15 or 16. For $M_{12}E_{16}$ compounds, $M_{12}$ may be cadmium (Cd), zinc (Zn), mercury (Hg), or any combination or alloy thereof, and $E_{16}$ may be oxygen (O), sulfur (S), selenium (Se), tellurium (Te), or any combination thereof. For $M_{13}E_{15}$ compounds, $M_{13}$ may be boron (B), aluminum (Al), gallium (Ga), indium (In) or any combination or alloy thereof, and $E_{15}$ may be nitrogen (N), phosphorous (P), arsenic (AS), antimony (Sb), bismuth (Bi), or any combination thereof. Any such metalloid or semiconductor element(s) or compound(s) may further include an appropriate dopant. Non-limiting examples of metal oxides include silica ($SiO_2$), alumina ($Al_2O_3$), titania ($TiO_2$), zirconia ($ZrO_2$), germania ($GeO_2$), stannia ($SnO_2$), gallia ($Ga_2O_3$), zinc oxide (ZnO), hafnia ($HfO_2$), yttria ($Y_2O_3$), lanthania ($La_2O_3$), ceria ($CeO_2$), or any combinations or alloys thereof. Non-limiting examples of a carbon-based intercalants include polymers, block copolymers, or polymer brushes. In a preferred embodiment, the intercalant can be a catalyst (e.g., a single-site catalyst) capable of catalyzing a chemical reaction. A diameter of each intercalant can range from 1 nm to 1000 nm, preferably 1 nm to 50 nm, or more preferably 1 nm to 5 nm. The single-site catalyst can be an intercalant having active sites where a critical reaction step occurs. Due to the affixing of the intercalant between the layers, the active sites on the intercalant can be isolated within the structure of the material.

The intercalants described above may be formed before, during (i.e., in situ), or after any stage of the exfoliation-functionalization/stabilization-restacking (the "formation process," described in detail below) through reaction of appropriate precursor materials. Non-limiting examples of such reactions include reduction, oxidation, thermal decomposition, or any other chemical or physical reaction. Precursors may be drawn from various classes of compounds and chemical systems, non-limiting examples of which include organometalic compounds, solubilized complexes, metal salts, and solvated ions, or any combination thereof. More specifically, the precursor material can be any appropriate compound containing an atom or atoms of the element or elements of which the intended resulting intercalant is included, and takes the general form $MO_yR$ or $MO_yX$, where M is a metal of interest (e.g., Pt, Au, Rh, Ru, Re, Os, Ir, Ag, Cu, Fe, Ni, Zn, Mn, Cr, Mo, W, Sn, Si, Al, Ti, Zr, Ge, Ga, Zn, Hf, Y, La, Ce), "y" is fixed by the oxidation state of M, R is an organic ligand, and X is an anion. In some embodiments, $0 < y \leq 3$. In other embodiments, y may exceed 3. In yet further embodiments, y=0; in such cases, the chemical formula $MO_yR$ is simplified to MR ("organometallics") and $MO_yX$ is simplified to MX ("salt"). Non-limiting examples of organic ligands (R) include alkanes, alkenes, alkynes, alcohols, aldehydes, carboxylic acids, phosphines, phosphonates, phosphonic acids, sulfates, sulfides, amines, or the like, or any combination or mixture thereof. Non-limiting examples of anions ($X^-$) can include halides (e.g., fluoride ($F^-$), chloride ($Cl^-$), bromide ($Br^-$), iodide ($I^-$)), negatively charged Column 15 elements (nitrogen (e.g., nitrides ($N^{3-}$), phosphides ($P^{3-}$), arsenide ($As^{3-}$), Column 16 based elements (e.g., sulfides ($S^{2-}$), selenides ($Se^{2-}$), tellurides ($Te^{2-}$)), or polyatomic compounds thereof (e.g., sulfates, sulfites, carbonates, carbonites, phosphates, phosphites, acetates, acetylacetonates), or any other appropriate anionic group.

B. Preparation of Intercalated 2D Non-Carbon Mono-Element Multi-Atomic Layered Material FIGS. 1 through 7 are schematics showing methods of preparing 2D non-carbon mono-element multi-atomic layered material with intercalant(s) and/or precursor(s) thereof intercalated therein along, and the resulting heterogeneous material. The methods of preparation can include one or more steps that can be used in combination to produce the final material. One sequence by which the preparation proceeds is: (1) dispersion; (2) exfoliation and stabilization/functionalization/modification; and (3) aggregation and restacking.

1. Dispersion

Figure 1B:
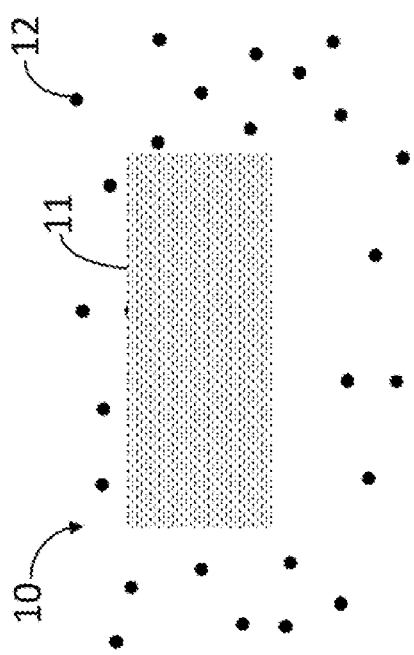

Referring to FIG. 1A, a dispersion (10) containing a parent substrate (11). As shown in FIG. 1A, precursors (12) are included in the dispersion. As shown in FIG. 1B, intercalants (13) can be included in the dispersion and precursors thereof omitted. In yet another embodiment, both intercalants and precursors of the same may be present (not shown). Appropriate media for the dispersion can include any suitable solvent, (e.g., water or any appropriate protic, aprotic, organic, polar, or non-polar solvent). A concentration of the parent substrate in the dispersion can range from $1 \times 10^{-5}$ molar to 5 molar, or $1 \times 10^{-4}$ molar to 4 molar, $1 \times 10^{-3}$ molar to 3 molar, $1 \times 10^{-2}$ molar to 2 molar, or 0.5 to 1 molar.

2. Exfoliation and Stabilization/Functionalization/Modification

The dispersion can be subjected to a chemical or mechanical process whereby the parent substrate can be exfoliated into single- or few-layered 2D sheets. Non-limiting examples of methods of exfoliation include chemical exfoliation, chemo-mechanical exfoliation, zipper exfoliation, polar or non-polar solvent exfoliation, ionic liquid based exfoliation, or sonication of the liquid composition. By way of example, the parent substrate or parent substrate containing solution can be exfoliated using sonication (i.e., chemo-mechanical exfoliation). The parent substrate can be sonicated for 1 min to 24 hr or 30 min to 12 hr, at a temperature of 20° C. to 200° C., or 25° C. to 100° C., a mixing rate of 0 to 1000 rpm or 50 to 500 rpm, and mixing or sonicating power of 0.1 W to 1000 W. In some aspects, the temperature of the parent substrate can be higher than the temperature of the sonicator bath due to the energy produced from sonication.

Figure 2A:
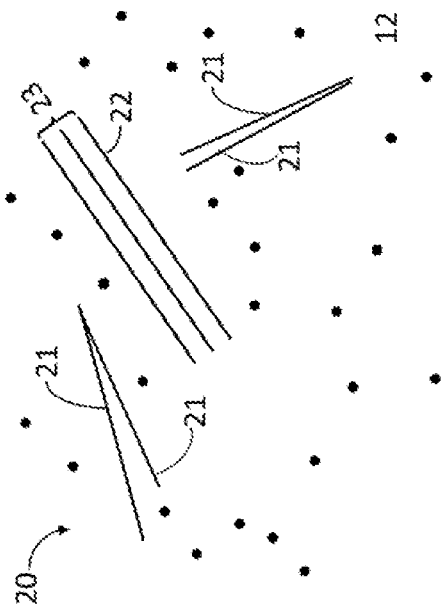
FIGS. 2A and 2B are schematics of a fully exfoliated (FIG. 2A) and a partially exfoliated (FIG. 2B) multi-atomic layered non-carbon mono-element stacks dispersed in a fluid medium in the presence of a plurality of intercalant(s) and/or precursor(s) thereof.
Figure 2B:
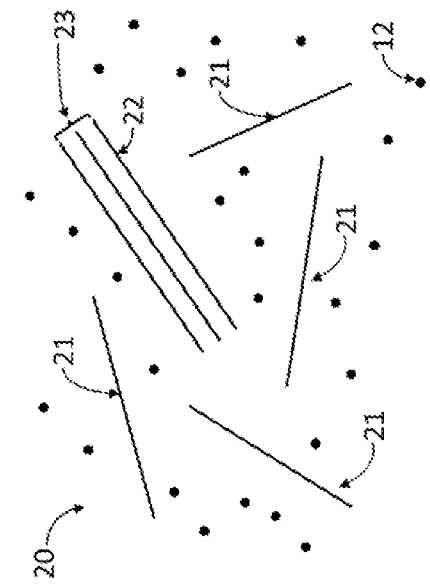

Referring to FIG. 2, a dispersion (20) is depicted where single layers (21) and/or multi-layer stacks (22) of the parent substrate are fully exfoliated and are dispersed as discrete free-standing elements in the dispersion solution, which also contains the precursor compound (12) (in one embodiment) and/or intercalants (in other embodiments). The number of layers, n, (23) in the multi-layer exfoliated stack typically range from $2 \leq n \leq 10$, or 2, 3, 4, 5, 6, 7, 8, 9, or 10.

Figure 3:
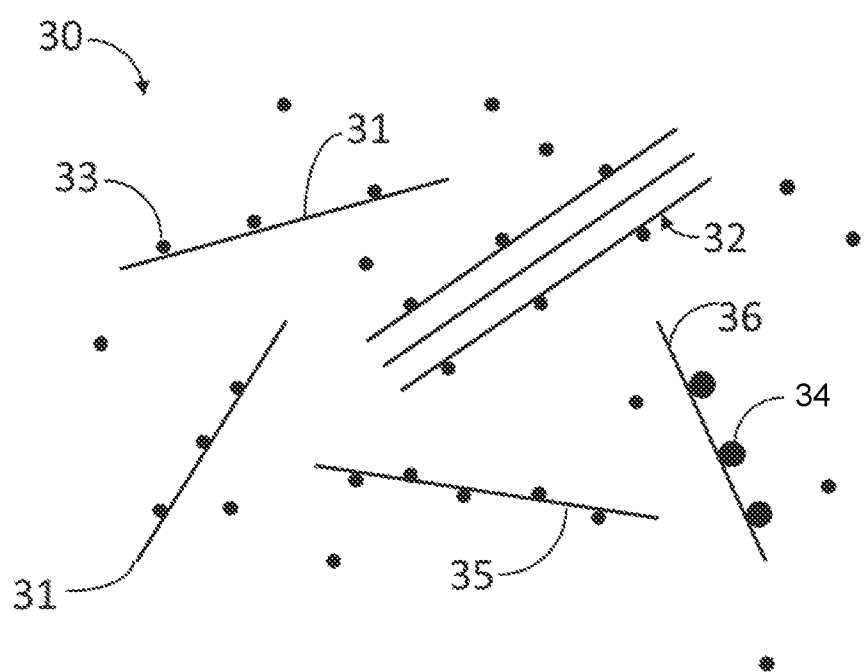
FIG. 3 is a schematic of a fully exfoliated multi-atomic layered non-carbon mono-element stack dispersed in a fluid medium in the presence of a plurality of intercalant(s) and/or precursor(s) there wherein the intercalants(s) and/or precursor(s) thereof have been immobilized to or functionalized the surface(s) of the exfoliated mono-element single-layer and/or few-layer stacks.

In certain aspects, after exfoliation, the surface of the free-standing 2D sheets can be stabilized and/or functionalized by the intercalant(s) and/or precursor(s) thereof. Stabilization/functionalization/modification can occur when by physical or chemical reaction between the 2D sheet and the intercalant/precursor compound, a chemical or physical bond between the two is created. Referring to FIG. 3, dispersion (30) is depicted where exfoliated single layers (31) and/or multi-layer stacks (32) of the parent substrate have been functionalized and/or stabilized by the precursors thereof (33) and/or intercalants (34). The result of this process is immobilization of the precursor (33) and/or intercalants (34) on the surface of the 2D sheet (31 and 35, respectively). In a separate embodiment, the intercalant(s) and/or precursor(s) may stabilize and/or functionalize the surface of the parent substrate prior to exfoliation. Without wishing to be bound by theory, such stabilization can facilitate the exfoliation process. The extent to which the surface of the 2D sheets can be covered by the intercalant(s) and/or precursor(s) thereof may be controlled by: (1) the order in which the exfoliation and stabilization/functionalization/modification occurs; and (2) the concentration of the intercalant(s) and/or precursor(s) thereof in the dispersion. FIG. 3 depicts a non-limiting variety of possibilities that serve as non-limiting examples, including: 2D mono-element single-layer 2D non-carbon sheets (31) stabilized/functionalized/modified on a single surface by precursor compounds (without wishing to be bound by theory, such a material can be produced through a process where the surface of the parent substrate can be stabilized/functionalized/modified prior to exfoliation and does not undergo subsequent stabilization/functionalization/modification after exfoliation; although not shown, an analogous material may be produced wherein the number of atomic layers, n, is such that $1<n\leq10$); 2D mono-element single-layer 2D non-carbon sheets (35) stabilized/functionalized/modified on both the top and bottom surfaces (without wishing to be bound by theory, such a material could be produced through a process where the surface of the parent substrate is stabilized/functionalized/modified prior to exfoliation and undergoes subsequent stabilization/functionalization/modification after exfoliation; alternatively, such a material can be produced through a process wherein exfoliation occurs prior to stabilization/functionalization/modification); 2D mono-element multi-layer 2D non-carbon sheets (32) functionalized on both the top and bottom surfaces (without wishing to be bound by theory, such a material can produced through any of the processes described above with reference to (35); and 2D mono-element single-layer 2D non-carbon sheets (36) stabilized/functionalized/modified on a surface by intercalants (without wishing to be bound by theory, such a material can be produced through any of the processes described above with reference to (31)). In a particular embodiment, although not depicted, architectures analogous to (32) and (35) may be produced where the 2D sheets are stabilized/functionalized/modified with intercalants instead of, or in addition to, precursors (without wishing to be bound by theory, any such materials could be produced through any of the processes described above for (31), (32), or (35)), substituting intercalants for, or incorporating intercalants alongside, precursors thereof. For materials with a plurality of layers, the edges may also be stabilized, functionalized, or modified or a combination thereof (not depicted).

In a particular aspect of the invention where only precursor compounds are included in the dispersion with the parent substrate (i.e., the dispersion does not contain intercalants upon initial preparation), the precursor compounds may be chemically or thermally reduced, such that the metal element of interest (i.e., M, as described above) is reduced to its lowest stable valence or a zero valent state (i.e., $M^o$). This result can be achieved by introducing a reducing agent or supplying thermal energy to the dispersion. In one embodiment, individual zero-valent atoms of element M (metals) can be produced. In some embodiments, nanoclusters of atoms can be produced. Without wishing to be bound by theory, those atoms can be free to intercalate into the parent substrate to facilitate exfoliation and additional stabilization/functionalization/modification of exfoliated 2D sheets.

In another aspect of the invention where only precursor compounds are included in the dispersion with the parent substrate (i.e., the dispersion does not contain intercalants upon initial preparation), exfoliation and stabilization/functionalization/modification may be accomplished as described above, at which point the dispersion can be subject to a method of reduction (i.e., by introducing a reducing agent to the dispersion or supplying thermal energy) or a chemical reaction sufficient to produce the element or compounds of interest contained within the precursor (e.g., M). Without wishing to be bound by theory, the result of such action can be to produce single atoms, a cluster of atoms, intercalants comprising element M or organic compounds, or a combinations thereof, tethered to the surface of the exfoliated 2D sheets.

3. Aggregation and Restacking

The final material of the present invention can be produced by allowing the dispersion to settle. In doing so, the stabilized/functionalized/modified exfoliated 2D sheets can aggregate and restack. In one aspect of the technology, this process can form a multi-layered structure with intercalant(s) and/or precursor(s) thereof intercalated between discrete 2D layers or a set of 2D layers. Driving forces for re-stacking or "rapid-restacking" can include the tendency of the parent atoms to form $sp^3$ hybridized states between the layers. Longer bond lengths with negligible or no pi orbital overlap can drive lattice distortion and thus, necessitate re-stacking. One way to control the restacking rate can be by using pristine powders. Referring to FIG. 4, a schematic of the final material (40) is depicted where intercalants (41) are intercalated between fully exfoliated individual layers of restacked mono-element atomic layers (42). In some instances, only a portion of the intercalant is positioned or intercalates between the layers (See, FIG. 5B). Analogous material systems are contemplated when precursor materials are substituted for the intercalant (41) or when both intercalants and precursors thereof are co-intercalated between individual layers of restacked mono-element atomic layers (42). As shown, the intercalants can be varied in size, however, it should be understood that the size and shape of the intercalant or precursor material can be any size or shape as long as a portion of the intercalant or precursor material can intercalate between the exfoliated layers.

In another aspect of the present invention, referring to FIGS. 5A and 5B, the restacking process described above can include exfoliated 2D sheets with a plurality of atomic layers, n, (with $1<n\leq10$), in which case, the final material (50) contains intercalants (41) intercalated between: (a) individual layers of restacked mono-element atomic layers (42); and/or (b) between individual layers that are separated by n layers (52) wherein no precursor compound is intercalated. In a preferred aspect, no region of the final material contains more than 20 consecutive monoatomic layers wherein no precursor compound is intercalated. As shown in FIG. 5B, the layers are partially exfoliated and a portion of the intercalant (41) is affixed between the two atomic layers (42) while other layers have the entire intercalant (41) immobilized between the two atomic layers (42). Analogous material systems include precursor compounds substituted for the intercalants (41) and when both intercalants and precursors thereof are co-intercalated between individual layers of restacked mono-element atomic layers (42). Also, it should be understood that the separated layers (52) are between layers are partially or not exfoliated layers (e.g., layers depicted in FIG. 5B).

In yet another aspect, referring to FIG. 6, exfoliated mono-element 2D sheets stabilized/functionalized/modified with intercalants on both the top and bottom surfaces (See, for example sheet (35) of FIG. 3) can restack forming a final material (60) having a intercalants (12) intercalated between individual layers of restacked mono-element atomic layers (42) and intercalant type material (61) on the outer surface of the layers. In an analogous system, both intercalants and precursors thereof can be co-intercalated between individual layers of restacked mono-element atomic layers (42). Other systems analogous to each of those just described where intercalated bilayers (comprising intercalants(s) and/or precursor(s) thereof) are separated by individual layers, n, wherein no precursor compound is intercalated. In a preferred aspect, no region of the final material contains more than 20 consecutive monoatomic layers wherein no intercalant or precursor compound is intercalated.

4. Exfoliation, Functionalization and Restacking

Figure 7A:
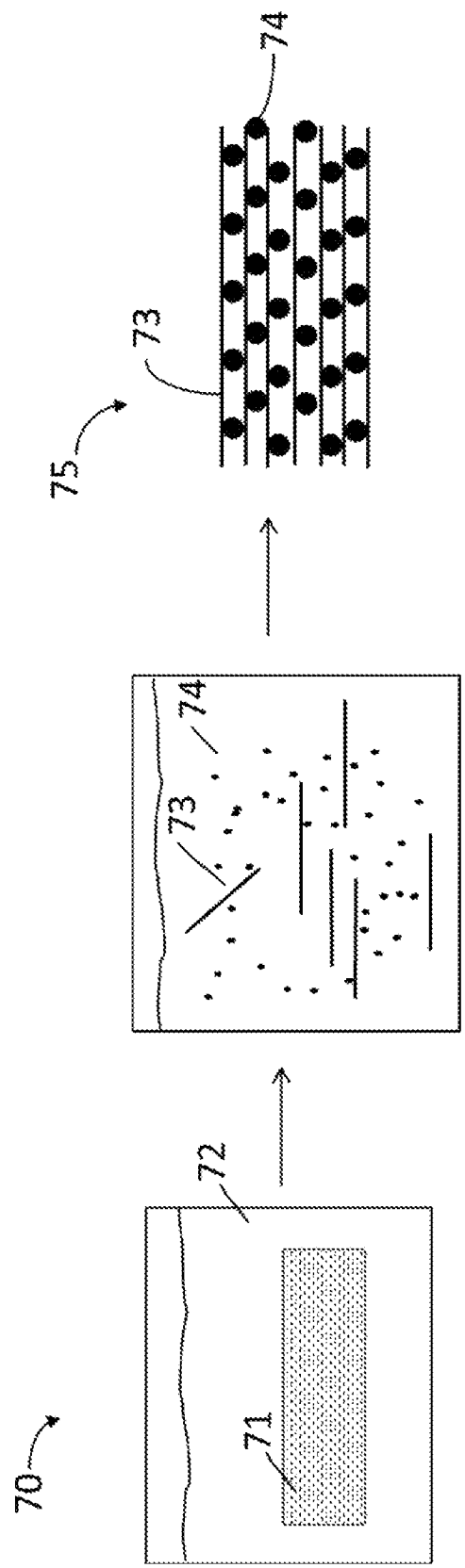
FIG. 7A is a schematic of method to prepare an exfoliated multi-atomic layered non-carbon mono-element stack of the present invention.

In some embodiments, functionalized powders and/or functionalized sites can be used to inhibit restacking and/or reduce the rate of restacking when single layers cannot be isolated using conventional exfoliation methods (e.g. silicene). By way of example, a parent substrate (e.g., functionalized silicene architectures) can be modified with another compound or metal (e.g., Ag, or intercalants) to result in intercalated multi-atomic layered material. Referring to FIG. 7A, a schematic of a one-pot exfoliation, functionalization, and restacking is depicted. In method 70, the parent substrate (e.g. $CaSi_2$) (71) can be chemically-exfoliated in a liquid phase (72) into single layers (73) using the methods as described throughout the specification and the Example Section. During this process, intercalants (74) (e.g., a silver salt) and reducing agent (not shown) can be introduced into the solution. After the nucleation of intercalants (i.e. Ag), the exfoliation process can be stopped and 2D layers of parent material (e.g., silicene) can be allowed to re-aggregate or re-stack to form exfoliated multi-atomic layered non-carbon mono-element stack (75) (e.g., a silver-silicene). In some embodiments, the size of nucleated intercalant (e.g., Ag) can be sub-nanometer and then the re-stacking process can be assisted by formation of $sp^3$ hybridization or inter-layer bonding in the 2D layer (e.g., silicene). In other embodiments, the nucleated intercalant can be sub-nanometer to 5 nm, and then the nucleated intercalant itself can provide sites for satisfying the $sp^3$ hybridization need of the re-stacked 2D layer. The liquid can be removed from the exfoliated multi-atomic layered non-carbon mono-element stack (75), and the stack (75) can be exposed to an oxygen source to convert the stack into a 2D oxide support (e.g., silicene oxide). Oxidation of the 2D support can result in a unique interaction with intercalant, impart high thermal stability, and enhanced lifetime of the 2D support. The interaction between the 2D layer and the intercalant can result in a robust confinement for the intercalant (e.g., Ag clusters) and at the same time provide atomically-flat surfaces between the stacked layers, which can be beneficial for specular transport of species (e.g., diffusion of the reactants into the layers and products out of the layers) during a catalytic reaction. When a catalytic metal is used, the process can result in a catalyst for high conversion and selectivity for a specific reaction. The specific catalytic reaction can be dependent on the material choice of clusters and 2D layers.

Figure 7B:
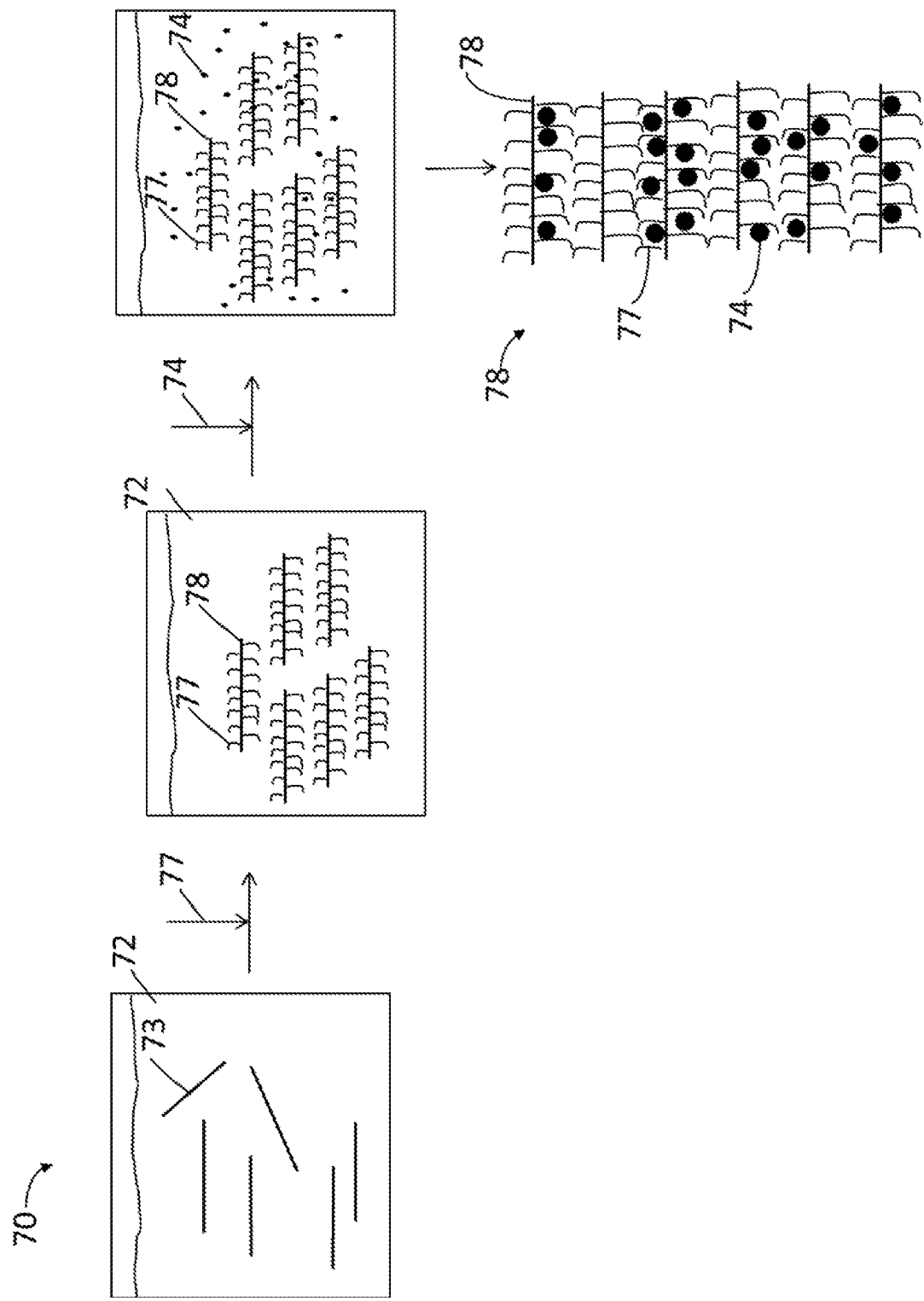
FIG. 7B is a schematic of a method to prepare an exfoliated functionalized multi-atomic layered non-carbon mono-element stack of the present invention.

Referring to FIG. 7B, functionalization of the single layers followed by intercalation of intercalants is depicted. As described in FIG. 7A, the parent material 71 can be exfoliated into single layer. Functionalizing agent (77) can be added to the solution and the single layers (73) can be reacted with a functionalizing agent to create functionalized layers (78). By way of example, exfoliated silicene layers can undergo hydrosilylation, aminization, or acylation (e.g., phenylation) reactions to produce silicate hydrocarbons, silicene amines (Si—Si—N bond), and phenylated silicene (Si—Si-phenyl). Intercalants (74) can be added to the solution and intercalated between the layers and/or functional groups during restacking of the layers to form intercalated multi-atomic layered material (78). Although FIGS. 7A and 7B are shown in a stepwise manner, the process can be performed in a single step by adding the intercalants and the functionalization agent to the solution during the same step.

In some instances, the above-mentioned intercalants or precursors thereof are affixed between the first and second atomic layers and can fill 1% to 80%, preferably 30% to 60%, of the volume between each 2D layer once restacked. A total weight percentage of the intercalants or precursor thereof can range from 10 wt. % to 90 wt. %.

In some embodiments, the material described throughout the specification is appropriate and ready for use when prepared as described above. In other embodiments, the material of the present invention may further be loaded onto a support material or carrier (e.g., for use in catalysis). Such a support material or a carrier to which the catalytic material of the present invention is affixed can be porous and have a high surface area. In some embodiments, the support includes a non-carbon oxide, alpha, beta or theta alumina ($Al_2O_3$), activated $Al_2O_3$, silica ($SiO_2$), titania ($TiO_2$), magnesia (MgO), calcium oxide (CaO), strontia (SrO), zirconia ($ZrO_2$), zinc oxide (ZnO), lithium aluminum oxide ($LiAlO_2$), magnesium aluminum oxide ($MgAlO_4$), manganese oxides (MnO, $MnO_2$, $Mn_2O_4$), lanthanum oxide ($La_2O_3$), activated carbon, silica gel, zeolites, activated clays, silicon carbide (SiC), diatomaceous earth, magnesia, aluminosilicate, calcium aluminate, carbon nanotubes (CNT), or boron nitride nanotubes (BNNT), or combinations thereof.

C. Applications of Intercalated 2D Non-Carbon Mono-Element Multi-Atomic Layered Material 1. Catalysts for Chemical Reactions In a particular instance, the materials of the present invention can be used as catalytic material suitable for use in any number of various chemical reactions. A non-exhaustive list of potentially suitable reactions which may be catalyzed by the materials of the present invention include a hydrocarbon cracking reaction, a hydrogenation of hydrocarbon reaction, a dehydrogenation of hydrocarbon reaction, an environmental remediation reaction, an epoxidation reaction, an automobile catalytic reaction, a solar energy harvesting reaction, a petrochemical conversion reaction, an oxidative coupling of methane reaction, a carbon dioxide to carbon monoxide conversion reaction, a methane to methanol reaction, a methanol to ethylene reaction, a water splitting, a hydrogen gas and oxygen to hydrogen peroxide reaction, a benzene to phenol reaction, an aryl to amine reaction, a benzene with $NH_3$ to $Bz-NH_2$ reaction, etc. By way of example, a 2D silicene oxide with embedded clusters of Pt/Sn can be used for a dehydrogenation reaction. A 2D silicene oxide or germicene oxide with embedded Ag clusters can be used for an epoxidation reaction. A 2D silicene oxide with embedded $CrO_x$ clusters can be used for a dehydrogenation reaction. A 2D silicene oxide with embedded Cu clusters can be used for $CO_2$ conversion. Similarly, alloyed nanoparticles or clusters, precious metal group systems, or other 2D material sheets or quantum dots can be embedded or positioned between the 2D layers for desired function.

Figure 8:
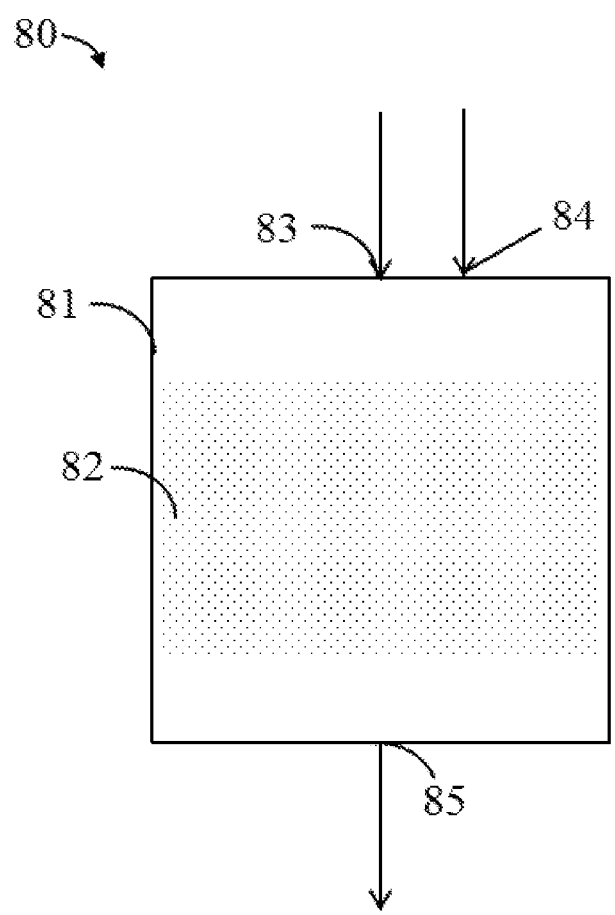
FIG. 8 is a schematic of an embodiment of a system that can be used to perform chemical reactions with the multi-layered material of the present invention.

Referring to FIG. 8, a schematic of a system (80) for use in a chemical reaction is depicted. System (80) may include a continuous flow reactor (81) and the multi-atomic layered material of the present invention (82). A reactant stream that includes chemical reactants can enter the continuous flow reactor (81) via a feed inlet (83). In one embodiment, the reactants can be provided to the continuous flow reactor (81) such that the reactants are heated to a temperature between ambient (i.e., room temperature) and the reaction temperature prior to contacting the catalytic material (82). In another embodiment, the catalytic material (82) and the reactant feed are each heated to the approximately the same temperature.

In some instances, the catalytic material (82) may be layered in the continuous flow reactor (81). In other instances, the catalytic material may be fed to the reactor while in contact with the reactant mixture in a fluidized bed configuration. In such an embodiment, the catalytic material may be pre-mixed with the reactant stream prior to entering the reactor (81) or it may be introduced through a second inlet stream (84) and brought into contact with the reactant feed immediately thereafter. Contact of the reactant mixture with the catalytic material (82) can produce a product stream. The product stream can exit the continuous flow reactor (81) via product outlet (85). The resulting product stream can be further processed and separated from any by-products using a variety of known gas/liquid separation techniques such as distillation, absorption, membranes, etc., to produce a purified product stream. In some instances, the products can then be used in additional downstream reaction schemes to create additional products.

2. Additional Applications

The intercalated 2D non-carbon mono-element multi-atomic layered materials described above (with or without support structures) can also be included in articles of manufacture, made into sheets, films, or incorporated into membranes. The sheet or film can have a thickness of 10 nm to 500 μm. The article of manufacture can be an energy storage/conversion/transport device, an actuator, a piezoelectric device, a sensor, a smart textile, a flexible device, an electronic device, an optical device, an optoelectronic device, an electro-optical device, a plasmonic device, a delivery device, a polymer nanocomposite, an actuating device, a MEMS/NEMS device, a logic device, a filtration/separation device, a capturing device, an electrochemical device, a display device etc. Other article of manufacture include curved surfaces, flexible surfaces, deformable surfaces, etc. Non-limiting examples of such articles of manufacture include virtual reality devices, augmented reality devices, fixtures that require flexibility such as adjustable mounted wireless headsets and/or ear buds, communication helmets with curvatures, medical batches, flexible identification cards, flexible sporting goods, packaging materials and/or applications where the presence of a bendable energy source simplifies final product design, engineering, and/or mass production

EXAMPLES

The present invention will be described in greater detail by way of specific examples. The following examples are offered for illustrative purposes only, and are not intended to limit the invention in any manner. Those of skill in the art will readily recognize a variety of noncritical parameters which can be changed or modified to yield essentially the same results.

Materials and Instrumentation

Calcium silicide ($CaSi_2$) and potassium hydroxide (KOH) were obtained from Fisher Chemical™ (Fisher Scientific International, Inc., U.S.A.). Chloroauric acid ($HAuCl_4$) and sodium borohydride ($NaBH_4$) were obtained from Sigma-Aldrich® (U.S.A.). Deionized water (DI) was obtained from a Thermo Scientific™ Barnstead™ DI water system-Smart2Pure™ (Fisher Scientific International, Inc., U.S.A.). Inductively coupled plasma (ICP) data was obtained using a Optima™ 8300 (Perkin Elmer, U.S.A.). X-ray diffraction (XRD) spectra was obtained using a Rigaku SmartLab X-Ray Diffractometer (Rigaku Americas Corporation, U.S.A.). Ramon spectra were obtained using a Renishaw inVia™ Raman Microscope (Renishaw, U.S.A.). Scanning Electron Microscopy (SEM) and Energy Dispersive Spectroscopy (EDS) data was obtained using a JSM-7800F (JEOL, U.S.A.). Transmission electron microscopy (TEM) data was obtained using a JEM-2010F (JEOL, U.S.A.).

Example 1

Method of Making a Au Intercalated Silicene Multi-Atomic Layered Material of the Present Invention In a controlled atmosphere (glove box), $CaSi_2$ ($1 \times 10^{-3}$M) was added to KOH (20 ml, 0.01 M) solution and stirred for 1-3 hours. To a portion (2 mL) of the $CaSi_2$/KOH solution, isopropyl/hydrochloric acid (0.6 gm) was added and stirred from 5 to 60 min. During the addition and agitation, evolution of gas was observed. The gas was assumed to be $H_2$. The acidified solution was sonicated for 15-30 min, and then $HAuCl_4$ (2 ml of a 3-4 mg $HAuCl_4$ in 40 ml water solution) was added under sonication. After 5-10 min of additional sonication, $NaBH_4$ (1 ml of 4.5 mg $NaBH_4$ in 2 ml water solution) was added, sonication was continued for 5-15 min, and then the solution was allowed to stand for >24 hrs for re-stacking of layered material to occur. The resulting solution had a top clear layer and precipitate. Characterization was conducted on the top clear solution layer and the precipitate. From the characterization, it was determined to be a mixture of gold intercalated silicene, silicon, and starting material.

Example 2

Characterization of Au Intercalated Silicene Multi-Atomic Layered Material of the Present Invention Characterization of the reaction intermediates and products was performed using SEM, TEM, ICP, EDS, XRD and Raman methodologies.

After KOH Addition.

Figure 9:
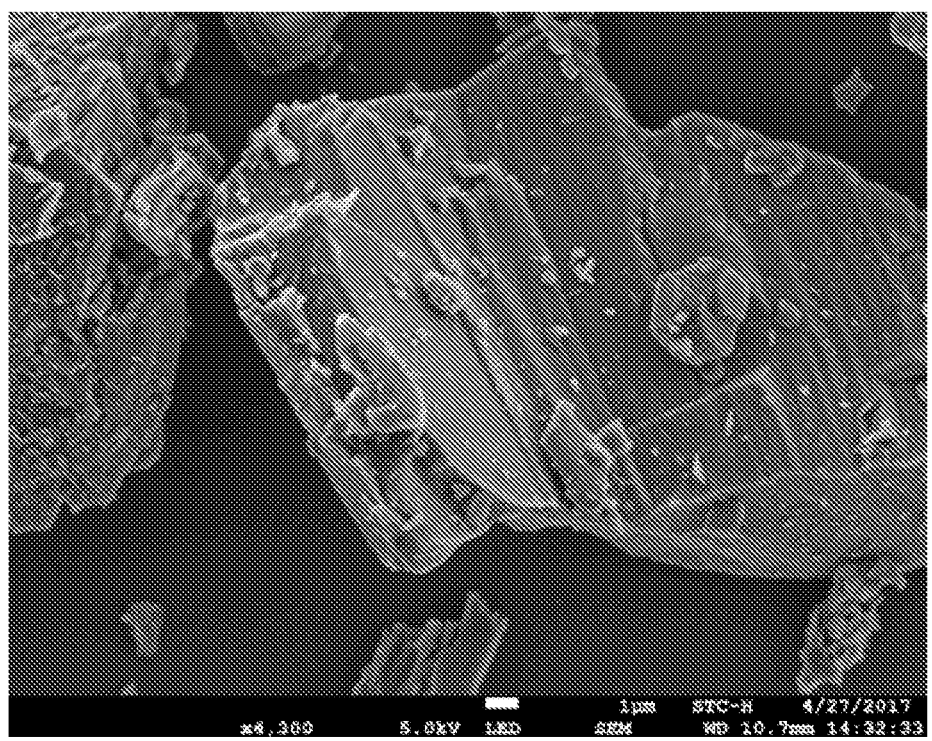
FIG. 9 is a scanning electron microcopy (SEM) image of $CaSi_2$ after KOH treatment.

After KOH addition, SEM analysis was performed on the $CaSi_2$. FIG. 9 is a SEM image of the bulk $CaSi_2$ after KOH treatment. From the SEM, it was determined that the $CaSi_2$ was not separated (i.e., in bulk form).

Immediately after Sonication has Ended.

Figure 10:
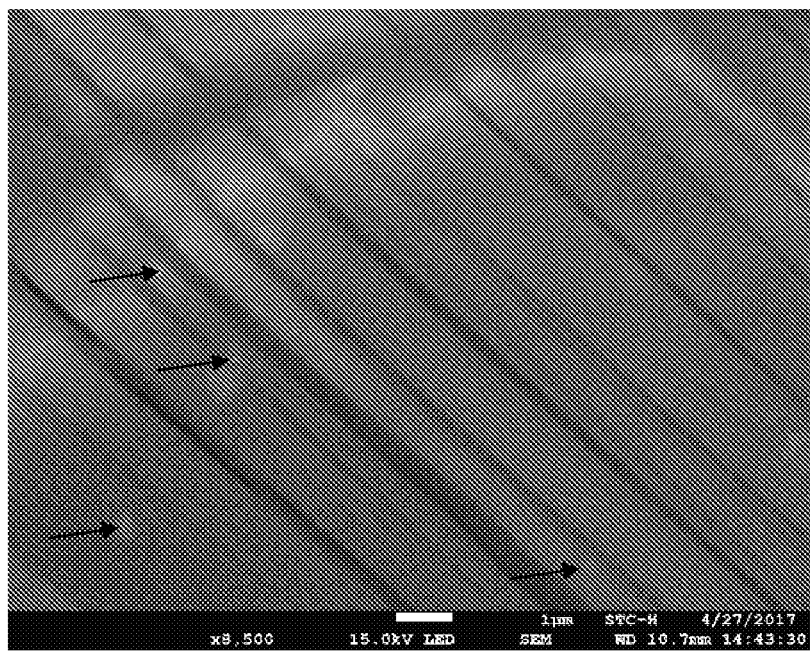
FIG. 10 is a SEM image of the precipitated material immediately after ending the sonication of $CaSi_2$.

The solution was sampled immediately after ending the sonication. FIG. 10 is a SEM image of the precipitated material immediately after ending the sonication. Comparing FIG. 10 to FIG. 9, it was determined that the bulk $CaSi_2$ had separated and started to restack as silicene (2-D silicon) with gold intercalated in the layers as layers are present in FIG. 10. Gold intercalates are the light colored spots (as indicated by the arrow).

1 Day after Sonication.

Figure 11:
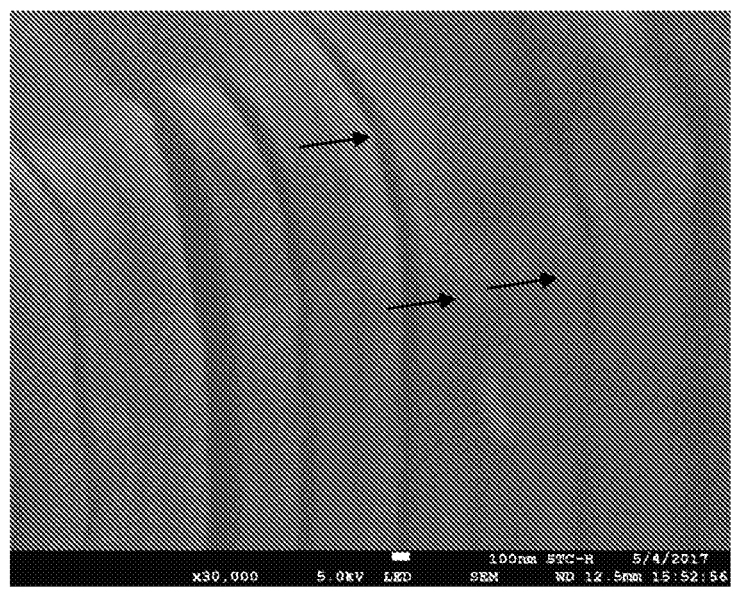
FIG. 11 is a SEM image of the precipitate twenty-four hours after sonication of $CaSi_2$.

FIG. 11 is a SEM image of the precipitate twenty-four hours after sonication of $CaSi_2$. From the image, it was determined that gold nanoparticles are intercalated (arrows) in the restacked silicene material.

1. ICP Analysis of Clear Layer and Au/$CaSi_2$ Precipitate.

Both the top clear liquid layer and the precipitate were analyzed by ICP for Si, Ca, and Au. Table 1 lists the ppm of Si, Ca, and Au in each layer. Comparing the data from the top layer to the precipitate layer, it was determined that the ratio of silicene or silicon nanostructures to calcium was about 10 times higher in the solution than in the precipitate.

Without wishing to be bound by theory, it is believed that the heavier silicide (silicon) material precipitated while the top clear layer included more 2D monoelement architectures (silicene material). Although the top solution appeared clear, from the data it was determined that it included re-stacked monoelements with intercalants.

TABLE 1

| Si ppm | Ca ppm | Au ppm |
|---|---|---|
| | Top layer | |
| 5.6 ± 0.2 | 13.8 ± 0.4 | 0.003 |
| | Precipitate | |
| 3.4 ± 0.2 | 104.7 ± 2 | 2.1 ± 0.03 |

2. EDS Analysis

Figure 12:
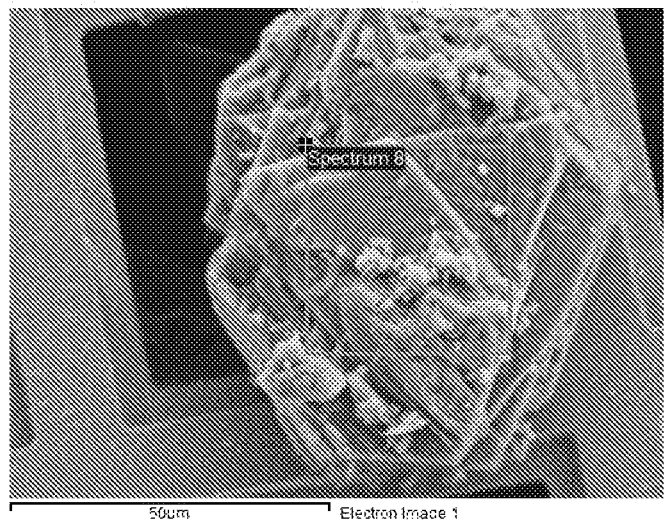
FIG. 12 is a SEM image of the precipitate twenty-four hours after sonication of $CaSi_2$ used for EDS analysis.

FIG. 12 is a SEM image of the precipitate twenty-four hours after sonication of $CaSi_2$ used for EDS analysis. EDS analysis was used on the flake shown in the SEM image of FIG. 12, with the area outlined by the square being evaluated. Table 2 lists the weight percent and atomic percent of the elements present in the flake. From the data, it was determined that the flake had a high silicon content as compared to Ca content, which indicated that the re-stacked flake was primarily silicon (Si), however, re-stacked silicene with intercalated Au were also detected. The Au signal was low because most of the Au was intercalated within the re-stacked layers.

TABLE 2

| Element | Weight % | Atomic % |
|---|---|---|
| O K | 10.87 | 18.70 |
| Si K | 77.23 | 75.70 |
| Ca K | 2.10 | 1.44 |
| Cu L | 9.50 | 4.12 |
| Au M | 0.29 | 0.04 |
| Total | 100.00 | 100.00 |

Figure 13:
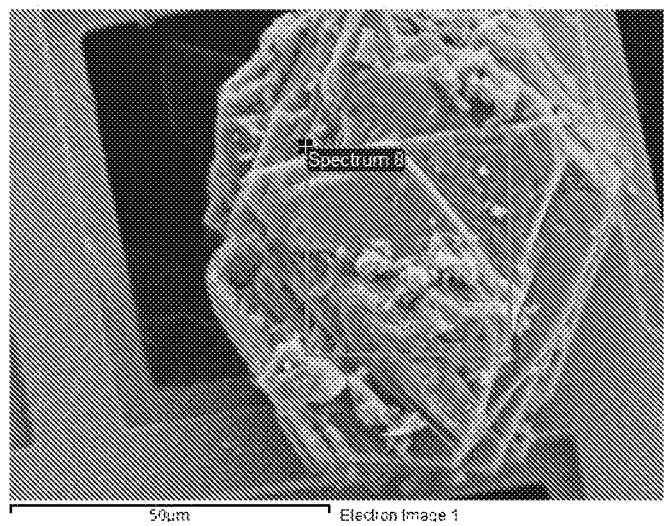
FIG. 13 is a SEM image of the $CaSi_2$ after KOH treatment.

EDS of the control $CaSi_2$ starting material (non-exfoliated) was performed. FIG. 13 is a SEM image of the $CaSi_2$ material after KOH treatment with the material inside the box being analyzed. Table 3 lists the weight percentage and atomic percentage of elements detected. From the data, it was determined that the Control $CaSi_2$ had about twice the Si content as compared with Ca (stoichiometrically, Ca:Si=1:2). While the sonicated sample showed exfoliated and re-stacked silicene with significantly high amount of Si in the system. Cu, Al, and O were present due to the base grid substrate on which the flakes were dispersed. K was present due to unwashed KOH.

TABLE 3

| Element | Weight % | Atomic % |
|---|---|---|
| C K | 10.28 | 18.87 |
| O K | 27.56 | 37.99 |
| Al K | 0.36 | 0.29 |
| Si K | 38.44 | 30.19 |
| K K | 0.10 | 0.05 |
| Ca K | 22.30 | 12.27 |
| Cu L | 0.97 | 0.34 |
| Totals | 100.00 | 100 |

3. TEM Analysis

Figure 14:
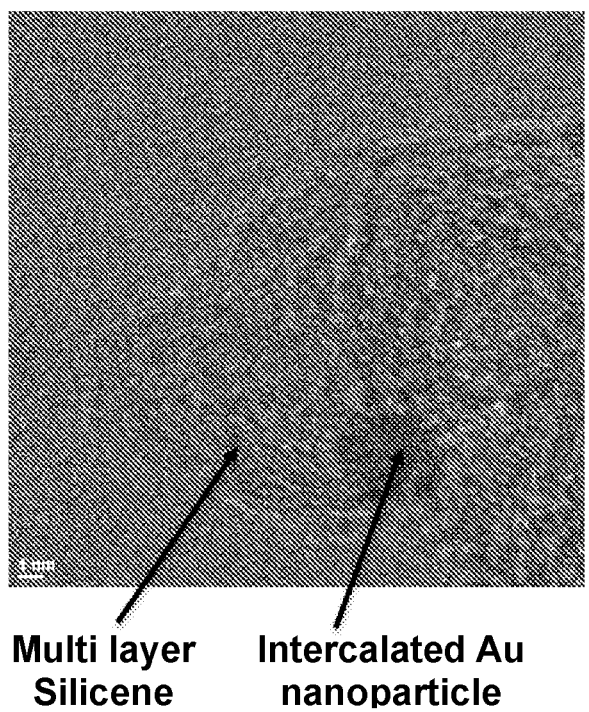
FIG. 14 is a transmission electron microscopy (TEM) image of the precipitate twenty-four hours after sonication of $CaSi_2$.

FIG. 14 is a TEM image of the precipitate twenty-four hours after sonication of $CaSi_2$. From the TEM image, it was determined that silicene layers with intercalated gold nanoparticles were present. The inter-layer spacing of the layers was 0.25 to 0.3 nm, which is consistent for silicene layers (strained or unstrained). The presence of 2 to 3 layers or multi-layers was observed.

4. XRD Analysis

Figure 15:
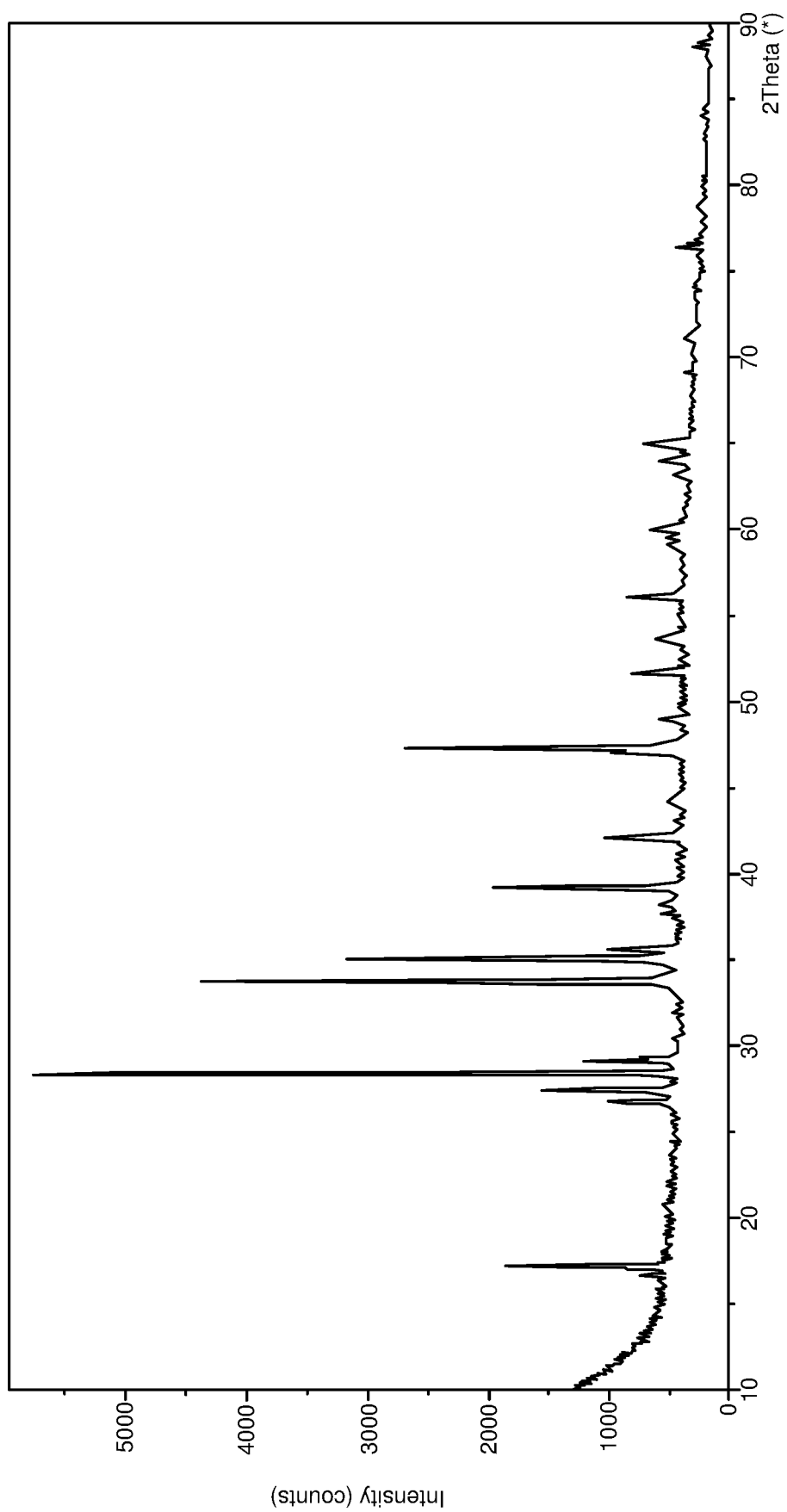
FIG. 15 depicts an XRD pattern of the precipitate twenty-four hours after sonication of $CaSi_2$.

FIG. 15 depicts an XRD pattern of the precipitate twenty-four hours after sonication of $CaSi_2$. Peaks at 29.18, 44.22 and 64.94 are attributed to gold (111, 200, 220 phases). The peak at 28.46 was attributed to Si. The rest of the peaks are attributable to calcium silicide. A trace amount of $SiO_2$ was present.

5. Raman Analysis

Figure 16:
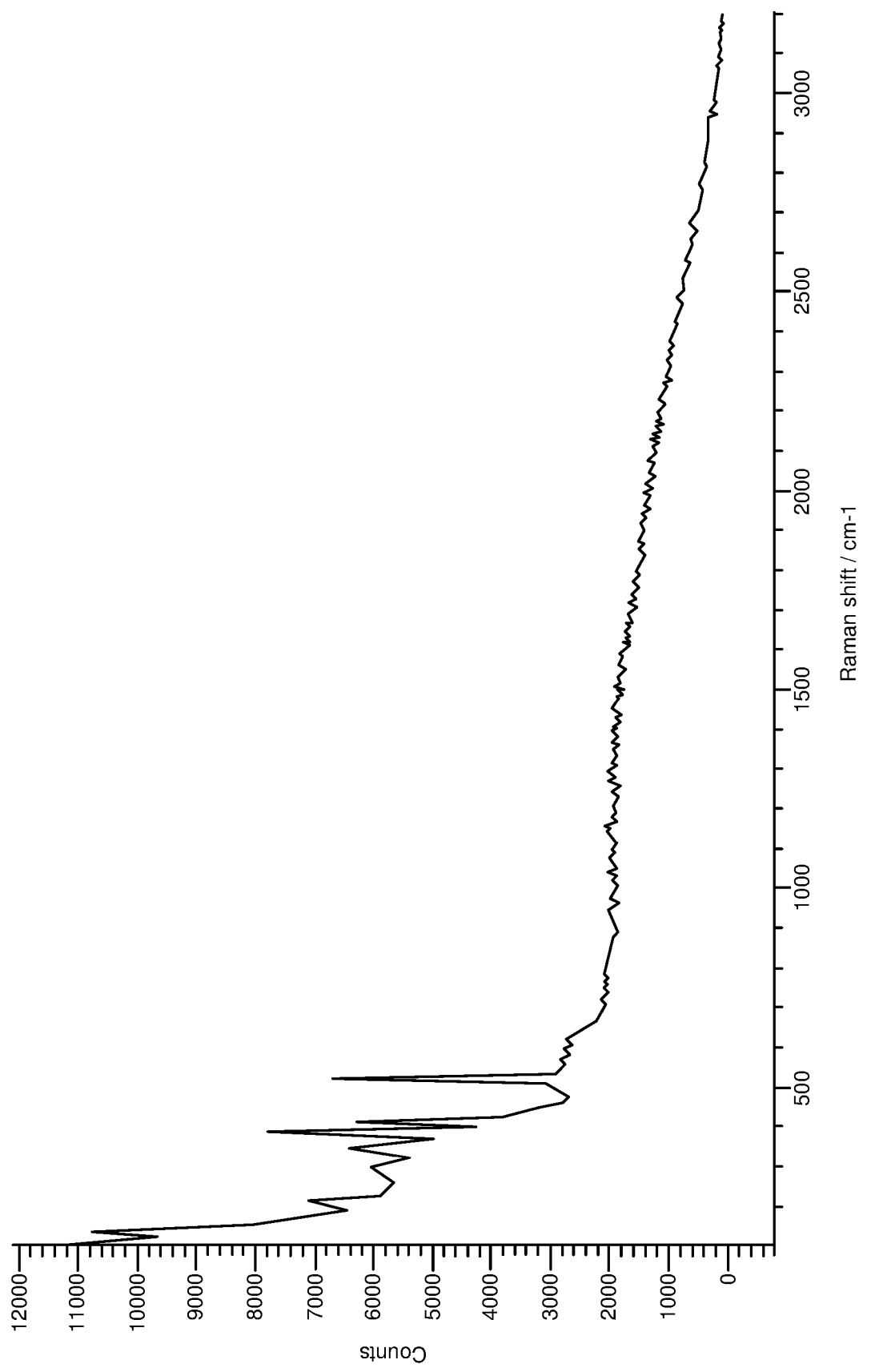
FIG. 16 is a Raman spectra of the precipitate twenty-four hours after sonication of $CaSi_2$.
Figure 17:
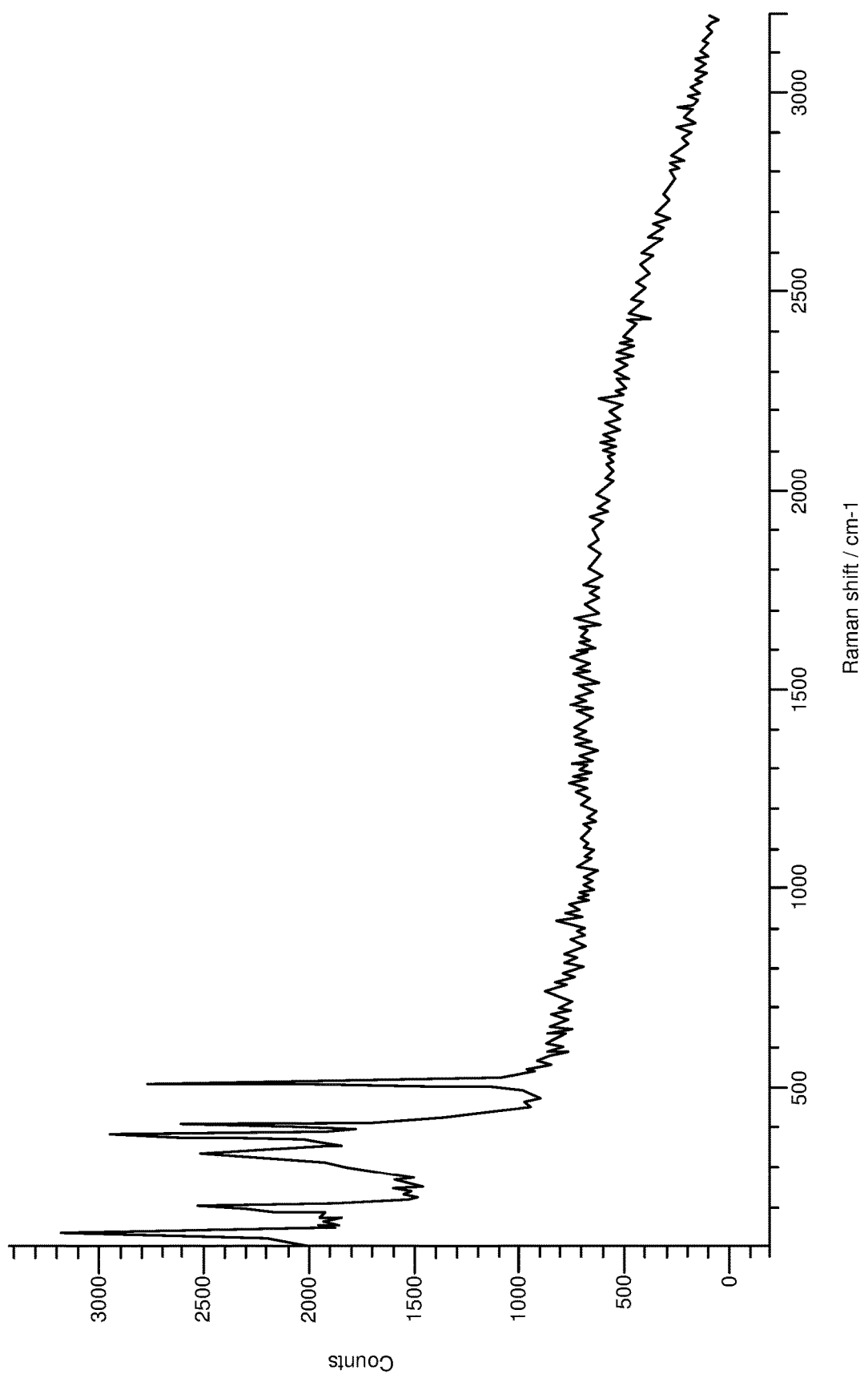
FIG. 17 is a Raman spectra of the $CaSi_2$ starting material after KOH treatment.

FIG. 16 is a Raman spectrum of the sonicated precipitate. FIG. 17 is a Raman spectrum of the $CaSi_2$ starting material after KOH treatment. Major peaks at 130.8, 208, 347.6, 385.9, 415.3, 519.3 $cm^{-1}$ were observed. The peak at 519.3 was attributed to multi-layer silicene as multi-layer silicene is known to have a Raman shift between 516 and 525. The shoulder between 520 $cm^{-1}$ and 570 $cm^{-1}$ was attributed to the gold nanoparticles. The starting $CaSi_2$ material had peaks at 129.1, 198.8, 334.3, 381.1, 407.3, 511.488 $cm^{-1}$. From the data, it was determined that some starting $CaSi_2$ material was present in the precipitate. However, a majority of the precipitate was the restacked gold intercalated silicene material.

From analysis of the data and the images, it was determined that a multi-layered material having a first 2D non-carbon mono-element atomic layer, a second 2D non-carbon mono-element atomic layer, and intercalants positioned between the first and second atomic layer was made using the method of the invention.

The invention claimed is:

1. A multi-atomic layered material comprising a first 2D mono-element atomic layer, a second 2D mono-element atomic layer, and intercalants positioned between the first and second atomic layers, wherein the first and second atomic layers have an inter-layer spacing and are bonded held together by van der Waals forces or sp3-hybridized bonding, or both;

wherein the first and second atomic layers are each individually a silicene atomic layer, a germanene atomic layer, a stanene atomic layer, a phosphorene atomic layer, a lead atomic layer, or a borophene atomic layer; and wherein the intercalants are affixed between the first and second atomic layers;

and wherein the intercalants are selected from the group consisting of polymers, block copolymers, polymer brushes, carbon-based intercalants, metal organic frameworks, zeolitic imidazolated frameworks, covalent organic frameworks, ionic liquids, liquid crystals, atomic clusters and nanoparticles comprising a metal or an oxide or alloy thereof, or any combination thereof, wherein the metal is selected from the group consisting of palladium (Pd), platinum (Pt), gold (Au), rhodium (Rh), ruthenium (Ru), rhenium (Re), osmium (Os), iridium (Ir) silver (Ag), copper (Cu), iron (Fe), nickel (Ni), zinc (Zn), manganese (Mn), chromium (Cr), molybdenum (Mo), tungsten (W), tin (Sn), boron (B), germanium (Ge), arsenic (As), antimony (Sb), tellurium (Te), polonium (Po), or combinations thereof.

2. The multi-atomic layered material of claim 1, wherein the first and second atomic layers are each individually a silicene atomic layer, a germanene atomic layer, a stanene atomic layer, and have an inter-layer spacing.

3. The multi-atomic layered material of claim 1, wherein the first and second atomic layers are each individually a silicene atomic layer, a germanene atomic layer, a stanene atomic layer, a lead atomic layer, or a borophene atomic layer.

4. The multi-atomic layered material of claim 3, wherein the first and second atomic layers are both: silicene atomic layers; germanene atomic layers; stanene atomic layers; lead atomic layers; or borophene atomic layers.

5. The multi-atomic layered material of claim 3, wherein the first and second atomic layers are different.

6. The multi-atomic layered material of claim 3, wherein the first or second atomic layers, or both layers, are functionalized.

7. The multi-atomic layered material of claim 1, the intercalant is an atomic cluster or nanoparticle comprising a metal or an oxide or alloy thereof, wherein the metal is selected from the group consisting of palladium (Pd), platinum (Pt), gold (Au), rhodium (Rh), ruthenium (Ru), rhenium (Re), osmium (Os), iridium (Ir) silver (Ag), copper (Cu), iron (Fe), nickel (Ni), zinc (Zn), manganese (Mn), chromium (Cr), molybdenum (Mo), tungsten (W) and tin (Sn), or combinations thereof.

8. The multi-atomic layered material of claim 1, wherein the first and second atomic layers are both: silicene atomic layers and the intercalant is Au.

9. The multi-atomic layered material of claim 1, wherein the intercalants are polymers, block copolymers, polymer brushes, carbon-based intercalants, metal organic frameworks, zeolitic imidazolated frameworks, covalent organic frameworks, ionic liquids, liquid crystals, or atomic clusters or nanoparticles comprising a metal or an oxide or alloy thereof, or any combination thereof.

10. The multi-atomic layered material of claim 9, wherein the metal is a noble metal or a transition metal or a combination or alloy or oxide thereof; wherein the metal is selected from the group consisting of palladium (Pd), platinum (Pt), gold (Au), rhodium (Rh), ruthenium (Ru), rhenium (Re), osmium (Os) and iridium (Ir), or any combinations or alloys thereof.

11. The multi-atomic layered material of claim 1, wherein the first and second atomic layers are oxidized.

12. The multi-atomic layered material of claim 1, wherein the first and second atomic layers are non-oxidized.

13. The multi-atomic layered material of claim 1, wherein the material further comprises a 2D atomic layer of graphene, graphyne, or graphane.

14. A device comprising the multi-atomic layered material of claim 1, the device comprising an energy storage/conversion/transport device, a sensor, a flexible sensor, an electronic device, an optoelectronic device, an optical device, a photo device, a thermal device, a coating material, or a catalyst.

15. A method of making any one of the multi-atomic layered materials of claim 1, the method comprising:
(a) obtaining a liquid composition comprising a multi-atomic layered mono-element stack dispersed therein;
(b) exfoliating the multi-atomic layered mono-element stack in the liquid composition in the presence of a intercalant or a precursor thereof; and
(c) allowing liquid solution to stand for greater than 10 hours, wherein the exfoliated multi-atomic layered mono-element stack re-aggregates and positions the intercalant or precursor thereof between at least a first 2D non-carbon mono-element atomic layer and a second 2D non-carbon mono-element atomic layer of the stack to obtain the multi-atomic layered material.

16. The multi-atomic layered material of claim 1, wherein the material further comprises a 2D atomic layer of graphyne.

17. The multi-atomic layered material of claim 1, wherein the material further comprises a 2D atomic layer of graphane.

18. The multi-atomic layered material of claim 1, wherein the intercalants are polymers.

19. The multi-atomic layered material of claim 1, wherein the material further comprises a 2D atomic layer of graphene.

* * * * *